United States Patent
Adya et al.

(10) Patent No.: US 10,242,144 B1
(45) Date of Patent: Mar. 26, 2019

(54) METHODS FOR MINIMIZING LOGIC OVERLAP ON INTEGRATED CIRCUITS

(71) Applicant: Altera Corporation, San Jose, CA (US)

(72) Inventors: Saurabh Adya, San Jose, CA (US); Mahesh A. Iyer, Fremont, CA (US); Love Singhal, San Jose, CA (US)

(73) Assignee: Altera Corporation, San Jose, CA (US)

( * ) Notice: Subject to any disclaimer, the term of this patent is extended or adjusted under 35 U.S.C. 154(b) by 78 days.

(21) Appl. No.: 15/338,134

(22) Filed: Oct. 28, 2016

(51) Int. Cl.
   *G06F 17/50* (2006.01)

(52) U.S. Cl.
   CPC ...... *G06F 17/5072* (2013.01); *G06F 17/5054* (2013.01); *G06F 17/5081* (2013.01); *G06F 2217/06* (2013.01)

(58) Field of Classification Search
   USPC ........................................................ 716/101
   See application file for complete search history.

(56) References Cited

U.S. PATENT DOCUMENTS

| | | | |
|---|---|---|---|
| 6,086,631 A | 7/2000 | Chaudhary et al. | |
| 6,957,406 B1 | 10/2005 | Stenz | |
| 7,587,441 B2 | 9/2009 | Yancey et al. | |
| 7,930,668 B1 | 4/2011 | Parsa | |
| 9,292,950 B2 | 3/2016 | Belanger | |
| 2006/0242613 A1* | 10/2006 | Fukazawa | G06F 17/5072 716/113 |

OTHER PUBLICATIONS

Iyer et al., U.S. Appl. No. 15/233,855, filed Aug. 10, 2016.

* cited by examiner

*Primary Examiner* — Bryce M Aisaka

(57) ABSTRACT

Configuration data for an integrated circuit may be generated using logic design equipment to implement an optimal design on the integrated circuit. Implementing the optimal design may include placing hardware resources within the integrated circuit to decrease or remove overlaps between corresponding hardware resources. A given hardware resource may be defined as a rectangular region, an adjacent hardware resource may be defined as another rectangular region, and together, they may be defined as a hardware resource pair. The hardware resource pair may define an overlap region, with which a cost function may be associated. The cost function may be minimized in conjunction with other types of cost functions using a solver. The solver may generate coordinates that minimize or remove overlap to be implemented in the optimal design.

13 Claims, 12 Drawing Sheets

US 10,242,144 B1

METHODS FOR MINIMIZING LOGIC OVERLAP ON INTEGRATED CIRCUITS

BACKGROUND

This relates to integrated circuits and more particularly, to systems for designing logic circuitry on integrated circuit devices such as programmable integrated circuits.

Programmable integrated circuits are a type of integrated circuit that can be programmed by a user to implement a desired custom logic function. In a typical scenario, a logic designer uses computer-aided design tools to design a custom logic circuit that performs custom logic functions. When the design process is complete, the computer-aided design tools generate configuration data. The configuration data is loaded into memory elements to configure the devices to perform the functions of the custom logic circuit. Memory elements are often formed using random-access-memory (RAM) cells. Because the RAM cells are loaded with configuration data during device programming, the RAM cells are sometimes referred to as configuration memory or configuration random-access-memory cells (CRAM).

Integrated circuits such as programmable integrated circuits often include millions of gates and megabits of embedded memory. The complexity of a large system requires the use of electronic design automation (EDA) tools to create and optimize a logic design for the system onto an integrated circuit (target device). The tools may perform logic synthesis operations to generate a gate-level description of the logic design for implementation on a target programmable logic device. Logic synthesis also performs technology mapping to map the gates onto logic elements (resources) that are available on the target programmable logic device. The logic elements are then physically placed and routed onto the target programmable device, while concurrently optimizing for timing, area, wiring, routing congestion, and power.

In practice, it is desirable for logic elements be placed adjacent to one another on the target programmable device without overlap or with minimal overlap. Overlapping logic elements can lead to increased complexity as well as other technical challenges when implementing the final overlap-free logic design, such that all legal placement rules are satisfied. In other cases, overlapping logic elements can render the logic elements inoperable.

SUMMARY

It is appreciated that the present invention can be implemented in numerous ways, such as a process, an apparatus, a system, a device, or a method on a computer readable medium. Several inventive embodiments of the present invention are described below.

An integrated circuit may include memory elements arranged in rows and columns. The integrated circuit may be a programmable integrated circuit that can be programmed (e.g., using configuration data) by a user to implement desired custom logic functions (logic designs or systems). The configuration data may be generated using a logic design system (e.g., logic design equipment). When a target device such as a programmable integrated circuit is loaded with the configuration data, the target device may be programmed to implement the logic design identified by the configuration data.

The logic design equipment may identify a plurality of rectangular regions within the logic design based on the hardware resources within the target device (e.g., a programmable integrated circuit). For example, the logic design equipment may identify first and second rectangular regions within the logic design.

As an example, the first and second rectangular regions may be two floating regions that have specialized functions (e.g., one of the two floating regions may be partially reconfigurable). As an example, one of the two rectangular regions may be a blockage region that has a fixed location within the integrated circuit. As an example, the first rectangular region may be a clock region, and the second rectangular region may be an operation sector of minimal clock usage. As an example, the first and second rectangular regions of the logic design may be spaced a pre-determined distance apart.

The logic design equipment may identify an overlap region between the first and second rectangular regions. Based on the identified overlap region, the logic design equipment may generate a cost function. Using the cost function, a solver engine within the logic design equipment may minimize the cost function to generate placement coordinates for the first and second rectangular regions. The logic design equipment may then generate a placed logic design by placing the first and second rectangular regions at the generated placement coordinates within a floorplan of the target device. The logic design equipment may then generate configuration data (e.g., configuration bit stream) based on the placed logic design.

The generated cost function may further include other types of constraints (e.g., other types of cost functions). The other types of constraints may include wiring constraints, timing constraints, congestion constraints, spread constraints, and sector minimization constraints.

In accordance with any of the above arrangements, non-transitory computer-readable storage media may include instructions for performing the operations described herein. Further features of the invention, its nature and various advantages, will be more apparent from the accompanying drawings and the following detailed description of the preferred embodiments.

DETAILED DESCRIPTION

Embodiments of the present invention relate to integrated circuits and, more particularly, to ways for improving placement of hardware resources in generating logic designs that are implemented on the integrated circuits.

Figure 1:
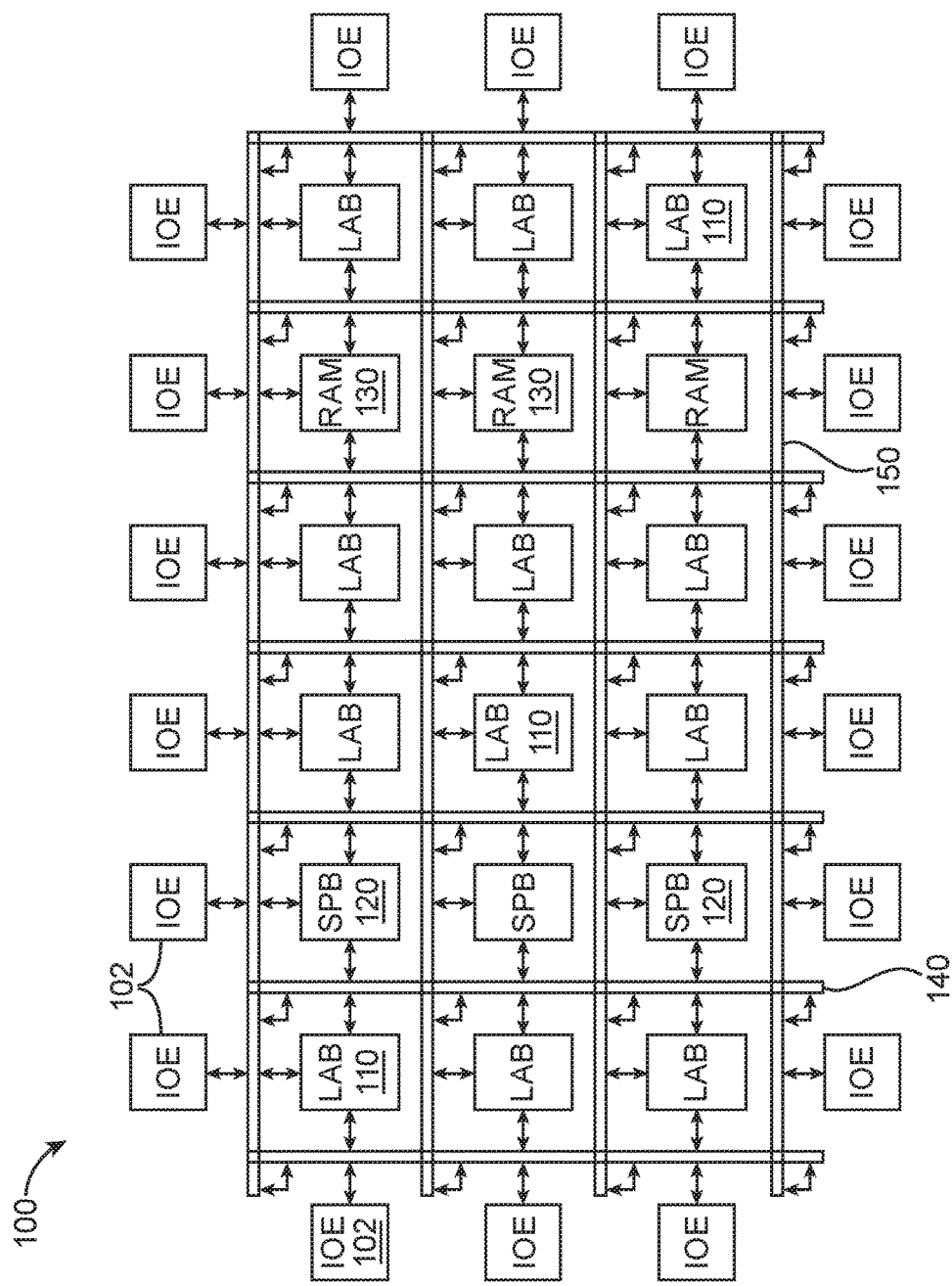
FIG. 1 is a diagram of an illustrative integrated circuit having an exemplary routing topology in accordance with an embodiment.

An illustrative embodiment of an integrated circuit such as programmable logic device (PLD) 100 having an exemplary interconnect circuitry is shown in FIG. 1. As shown in FIG. 1, the programmable logic device (PLD) may include a two-dimensional array of functional blocks, including logic array blocks (LABs) 110 and other functional blocks, such as random access memory (RAM) blocks 130 and digital signal processing (DSP) blocks 120, for example. Functional blocks such as LABs 110 may include smaller programmable regions (e.g., logic elements, configurable logic blocks, or adaptive logic modules) that receive input signals and perform custom functions on the input signals to produce output signals.

Programmable logic device 100 may contain programmable memory elements. Memory elements may be loaded with configuration data (also called programming data) using input/output elements (IOEs) 102. Once loaded, the memory elements each provide a corresponding static control signal that controls the operation of an associated functional block (e.g., LABs 110, DSP 120, RAM 130, or input/output elements 102).

In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration RAM (CRAM), configuration memory elements, or programmable memory elements.

In addition, the programmable logic device may have input/output elements (IOEs) 102 for driving signals off of PLD and for receiving signals from other devices. Input/output elements 102 may include parallel input/output circuitry, serial data transceiver circuitry, differential receiver and transmitter circuitry, or other circuitry used to connect one integrated circuit to another integrated circuit. As shown, input/output elements 102 may be located around the periphery of the chip. If desired, the programmable logic device may have input/output elements 102 arranged in different ways. For example, input/output elements 102 may form one or more columns of input/output elements that may be located anywhere on the programmable logic device (e.g., distributed evenly across the width of the PLD). If desired, input/output elements 102 may form one or more rows of input/output elements (e.g., distributed across the height of the PLD). Alternatively, input/output elements 102 may form islands of input/output elements that may be distributed over the surface of the PLD or clustered in selected areas.

The PLD may also include programmable interconnect circuitry in the form of vertical routing channels 140 (i.e., interconnects formed along a vertical axis of PLD 100) and horizontal routing channels 150 (i.e., interconnects formed along a horizontal axis of PLD 100), each routing channel including at least one track to route at least one wire. If desired, the interconnect circuitry may include double data rate interconnections and/or single data rate interconnections. A double data rate interconnection may convey twice the amount of data compared to a single data rate interconnection when operated at the same clock frequency.

If desired, routing wires may be shorter than the entire length of the routing channel. A length L wire may span L functional blocks. For example, a length four wire may span four blocks. Length four wires in a horizontal routing channel may be referred to as "H4" wires, whereas length four wires in a vertical routing channel may be referred to as "V4" wires.

Different PLDs may have different functional blocks which connect to different numbers of routing channels. A three-sided routing architecture is depicted in FIG. 1 where input and output connections are present on three sides of each functional block to the routing channels. Other routing architectures are also intended to be included within the scope of the present invention. Examples of other routing architectures include 1-sided, 1½-sided, 2-sided, and 4-sided routing architectures.

In a direct drive routing architecture, each wire is driven at a single logical point by a driver. The driver may be associated with a multiplexer which selects a signal to drive on the wire. In the case of channels with a fixed number of wires along their length, a driver may be placed at each starting point of a wire.

Note that other routing topologies, besides the topology of the interconnect circuitry depicted in FIG. 1, are intended to be included within the scope of the present invention. For example, the routing topology may include wires that travel diagonally or that travel horizontally and vertically along different parts of their extent as well as wires that are perpendicular to the device plane in the case of three dimensional integrated circuits, and the driver of a wire may be located at a different point than one end of a wire. The routing topology may include global wires that span substantially all of PLD 100, fractional global wires such as wires that span part of PLD 100, staggered wires of a particular length, smaller local wires, or any other suitable interconnection resource arrangement.

Furthermore, it should be understood that embodiments of the present invention may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Figure 2:
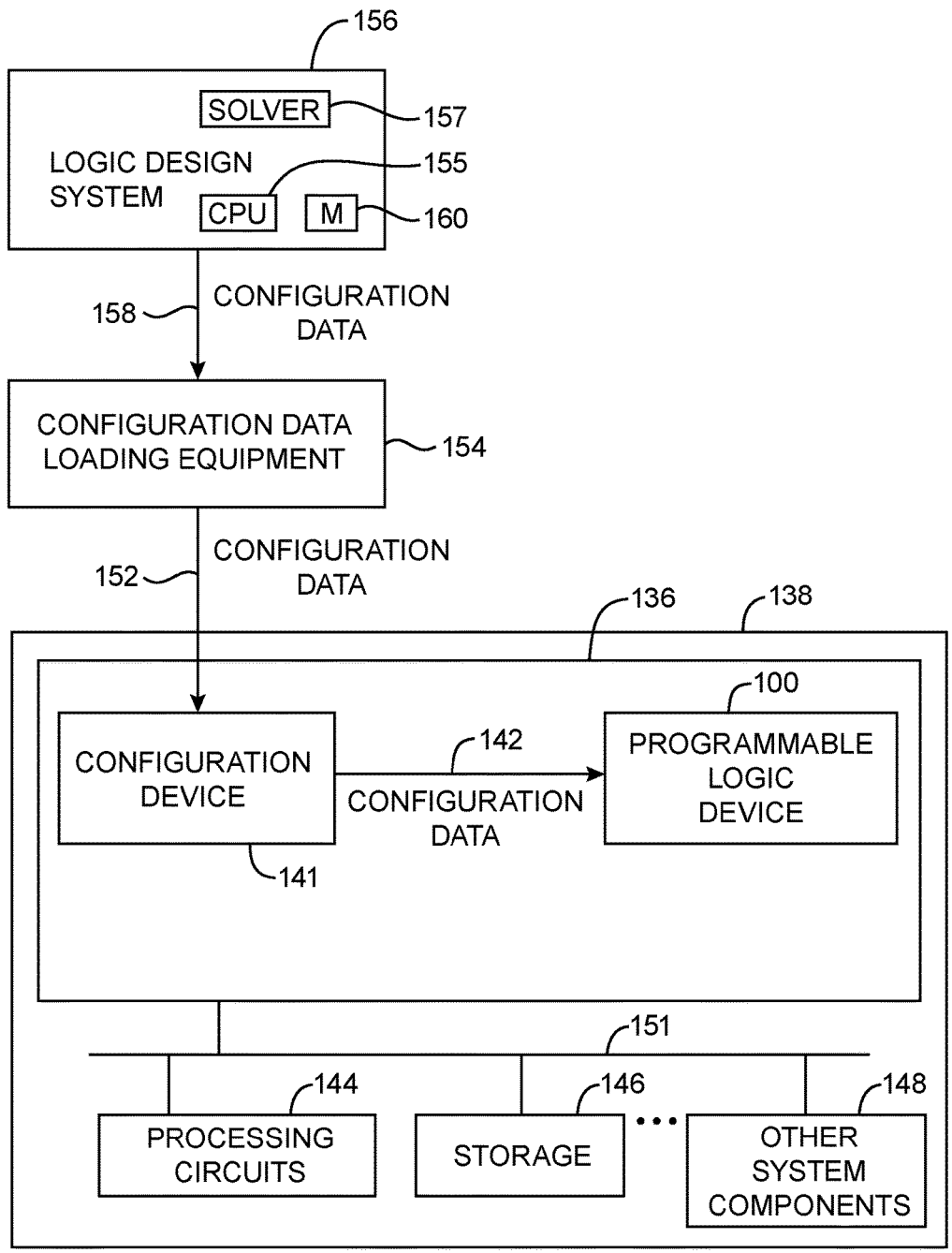
FIG. 2 is an illustrative diagram showing how configuration data may be generated by a logic design system and loaded into a programmable device in accordance with an embodiment.

The various structures and components that are included in an integrated circuit can be designed using a circuit design system. An illustrative system environment for device 100 is shown in FIG. 2. Device 100 may, for example, be mounted on a board 136 in a system 138. In general, programmable logic device 100 may receive configuration data from programming equipment or from other suitable equipment or device. In the example of FIG. 2, programmable logic device 100 is the type of programmable logic device that receives configuration data from an associated integrated circuit 141. With this type of arrangement, circuit 141 may, if desired, be mounted on the same board 136 as programmable logic device 100. Circuit 141 may be an erasable-programmable read-only memory (EPROM) chip, a programmable logic device configuration data loading chip with built-in memory (sometimes referred to as a configuration device), or other suitable devices. When system 138 boots up (or at another suitable time), the configuration data for configuring the programmable logic device may be supplied to the programmable logic device from device 141, as shown schematically by path 142. The configuration data that is supplied to the programmable logic device may be stored in the programmable logic device in its configuration random-access-memory elements.

System 138 may include processing circuits 144, storage 146, and other system components 148 that communicate with device 100. The components of system 138 may be located on one or more boards such as board 136 or other suitable mounting structures or housings and may be interconnected by buses and other electrical paths 151. If desired, programmable device 100 may be loaded with configuration data without mounting device 100 and/or configuration device 141 to board 136 (e.g., using any desired configuration data loading equipment).

Configuration device 141 may be supplied with the configuration data for device 100 (sometimes referred to herein as target circuit or target device 100) over a path such as path 152. Configuration device 141 may, for example, receive the configuration data from configuration data loading equipment 154 or other suitable equipment that stores this data in configuration device 141. Device 141 may be loaded with data before or after installation on board 136.

It can be a significant undertaking to design and implement a desired (custom) logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 156 (sometimes referred to herein as logic design equipment 156, logic design computer 156, logic design processor 156, logic design computing equipment 156, logic design circuitry 156, or data stream generation circuitry 156) may be provided to equipment 154 over a path such as path 158. Equipment 154 provides the configuration data to device 141, so that device 141 can later provide this configuration data to the programmable logic device 100 over path 142. System 156 may be based on one or more computers and one or more software programs. In general, software and data may be stored on any computer-readable medium (storage) in system 156 and is shown schematically as storage 160 in FIG. 2. System 156 may include processing circuitry in the form of one or more processors such as central processing unit (CPU) 155. In general, any desired processing circuitry may be formed on system 156. For example, system 156 may include solver circuitry 157 (sometimes referred to herein as solver engine 157, or solver 157). Solver circuitry 157 may be used to solve constrained systems of equations. This is merely illustrative. Solver circuitry 157 may be any suitable type of solver and use any desired method of solving a suitable number of equations (e.g., equations of cost functions), while optimizing various cost functions.

In a typical scenario, logic design system 156 is used by a logic designer to create a custom circuit (logic) design. For example, the logic designer may provide input commands to logic design system 156 (e.g., by selecting on screen commands displayed on a display screen, by entering commands using a user input device such as a mouse and/or keyboard, etc.). The system 156 produces corresponding configuration data which is provided to configuration device 141. Upon power-up, configuration device 141 and data loading circuitry on programmable logic device 100 are used to load the configuration data into CRAM cells on device 100. Device 100 may then be used in normal operation of system 138. The example of FIG. 2 is merely illustrative. In general, any desired system may be used to load configuration data generated by logic design system 156 onto programmable logic device 100.

Figure 3:
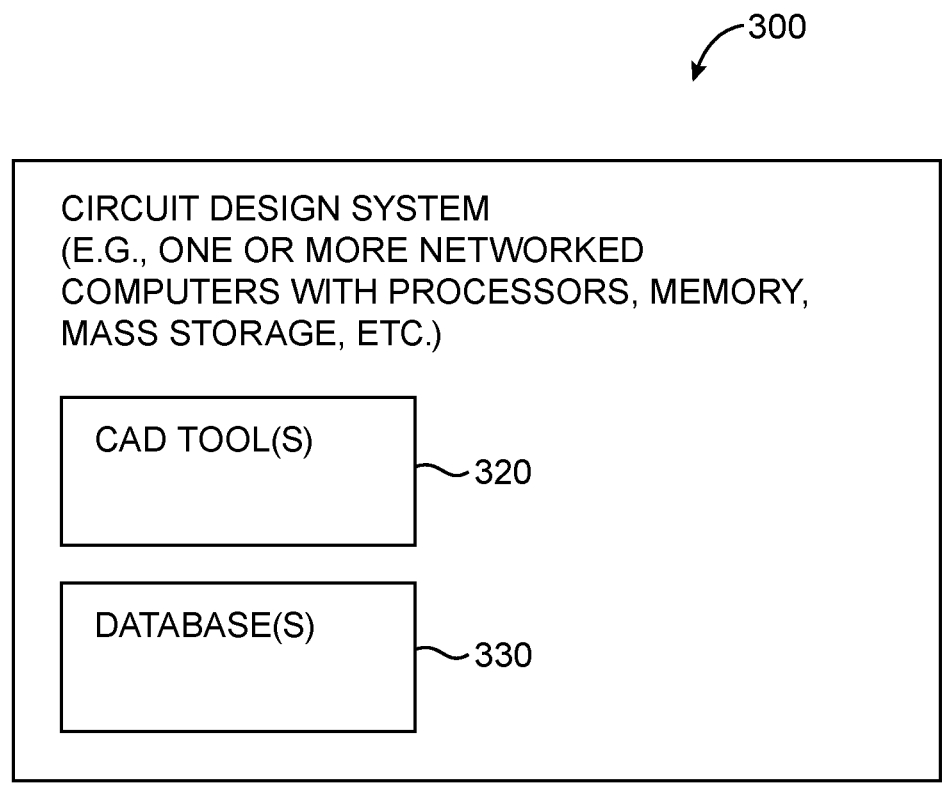
FIG. 3 is a diagram of a circuit design system that may be used to design integrated circuits in accordance with an embodiment.

An illustrative circuit design system 300 in accordance with an embodiment is shown in FIG. 3. If desired, circuit design system of FIG. 3 may be used in a logic design system such as logic design system 156 shown in FIG. 2. Circuit design system 300 may be implemented on integrated circuit design computing equipment. For example, system 300 may be based on one or more processors such as personal computers, workstations, etc. The processor(s) may be linked using a network (e.g., a local or wide area network). Memory in these computers or external memory and storage devices such as internal and/or external hard disks may be used to store instructions and data.

Software-based components such as computer-aided design tools 320 and databases 330 reside on system 300. During operation, executable software such as the software of computer aided design tools 320 runs on the processor(s) of system 300. Databases 330 are used to store data for the operation of system 300. In general, software and data may be stored on any computer-readable medium (storage) in system 300. Such storage may include computer memory chips, removable and fixed media such as hard disk drives, flash memory, compact discs (CDs), digital versatile discs (DVDs), Blu-ray discs (BDs), other optical media, and floppy diskettes, tapes, or any other suitable memory or storage device(s). When the software of system 300 is installed, the storage of system 300 has instructions and data that cause the computing equipment in system 300 to execute various methods (processes). When performing these processes, the computing equipment is configured to implement the functions of the circuit design system.

The computer aided design (CAD) tools 320, some or all of which are sometimes referred to collectively as a CAD tool, a circuit design tool, or an electronic design automation (EDA) tool, may be provided by a single vendor or by multiple vendors. Tools 320 may be provided as one or more suites of tools (e.g., a compiler suite for performing tasks associated with implementing a circuit design in a programmable logic device) and/or as one or more separate software components (tools). Database(s) 330 may include one or more databases that are accessed only by a particular tool or tools and may include one or more shared databases. Shared databases may be accessed by multiple tools. For example, a first tool may store data for a second tool in a shared database. The second tool may access the shared database to retrieve the data stored by the first tool. This allows one tool to pass information to another tool. Tools may also pass information between each other without storing information in a shared database if desired.

Figure 4:
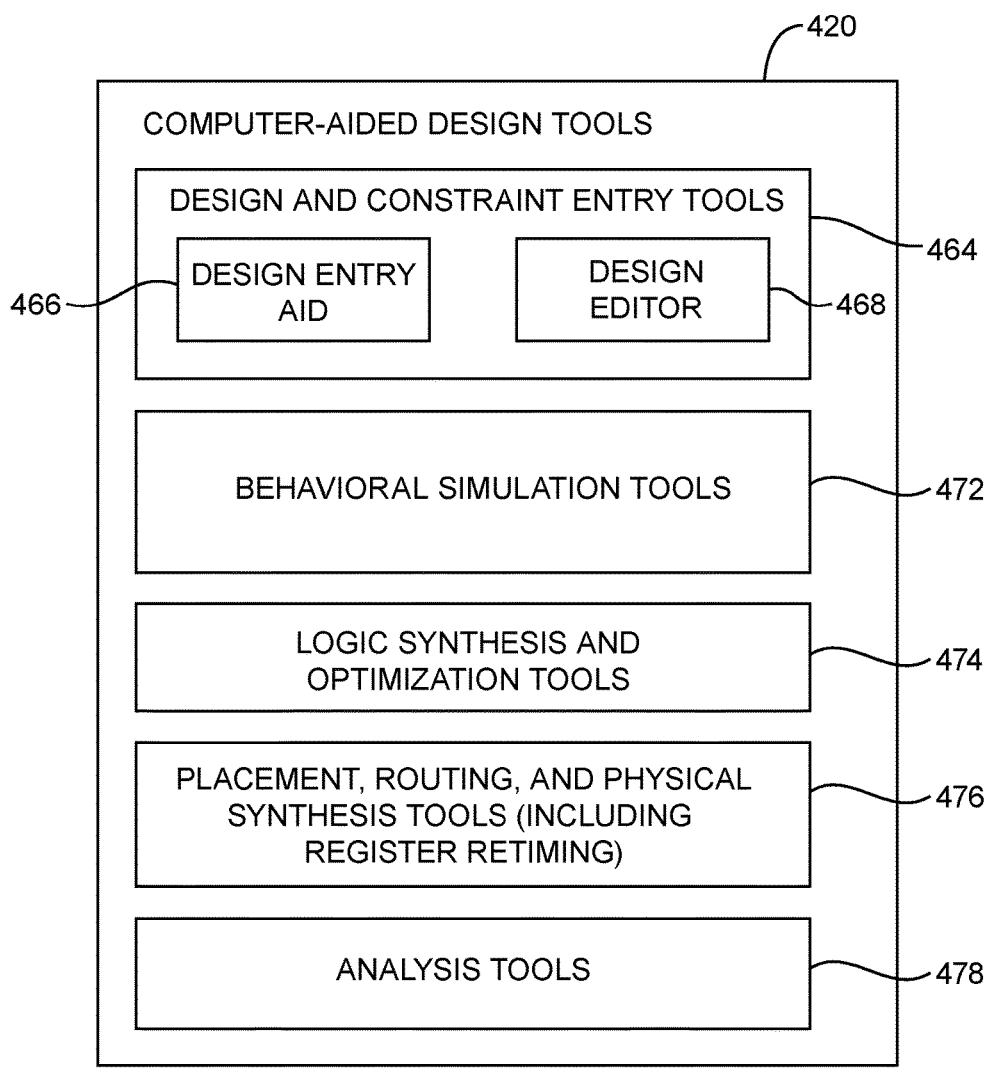
FIG. 4 is a diagram of illustrative computer-aided design (CAD) tools that may be used in a circuit design system in accordance with an embodiment.

Illustrative computer aided design tools 420 that may be used in a circuit design system such as circuit design system 300 of FIG. 3 are shown in FIG. 4.

The design process may start with the formulation of functional specifications of the integrated circuit design (e.g., a functional or behavioral description of the integrated circuit design). A circuit designer may specify the functional operation of a desired circuit design using design and constraint entry tools 464. Design and constraint entry tools 464 may include tools such as design and constraint entry aid 466 and design editor 468. Design and constraint entry aids such as aid 466 may be used to help a circuit designer locate a desired design from a library of existing circuit designs and may provide computer-aided assistance to the circuit designer for entering (specifying) the desired circuit design.

As an example, design and constraint entry aid 466 may be used to present screens of options for a user. The user may click on on-screen options to select whether the circuit being designed should have certain features. Design editor 468 may be used to enter a design (e.g., by entering lines of hardware description language code), may be used to edit a design obtained from a library (e.g., using a design and constraint entry aid), or may assist a user in selecting and editing appropriate prepackaged code/designs.

Design and constraint entry tools 464 may be used to allow a circuit designer to provide a desired circuit design using any suitable format. For example, design and constraint entry tools 464 may include tools that allow the circuit designer to enter a circuit design using truth tables. Truth tables may be specified using text files or timing diagrams and may be imported from a library. Truth table circuit design and constraint entry may be used for a portion of a large circuit or for an entire circuit.

As another example, design and constraint entry tools 464 may include a schematic capture tool. A schematic capture tool may allow the circuit designer to visually construct integrated circuit designs from constituent parts such as logic gates and groups of logic gates. Libraries of preexisting integrated circuit designs may be used to allow a desired portion of a design to be imported with the schematic capture tools.

If desired, design and constraint entry tools 464 may allow the circuit designer to provide a circuit design to the circuit design system 300 using a hardware description language such as Verilog hardware description language (Verilog HDL), Very High Speed Integrated Circuit Hardware Description Language (VHDL), SystemVerilog, or a higher-level circuit description language such as OpenCL or SystemC, just to name a few. The designer of the integrated circuit design can enter the circuit design by writing hardware description language code with editor 468. Blocks of code may be imported from user-maintained or commercial libraries if desired.

After the design has been entered using design and constraint entry tools 464, behavioral simulation tools 472 may be used to simulate the functionality of the circuit design. If the functionality of the design is incomplete or incorrect, the circuit designer can make changes to the circuit design using design and constraint entry tools 464. The functional operation of the new circuit design may be verified using behavioral simulation tools 472 before synthesis operations have been performed using tools 474. Simulation tools such as behavioral simulation tools 472 may also be used at other stages in the design flow if desired (e.g., after logic synthesis). The output of the behavioral simulation tools 472 may be provided to the circuit designer in any suitable format (e.g., truth tables, timing diagrams, etc.).

Once the functional operation of the circuit design has been determined to be satisfactory, logic synthesis and optimization tools 474 may generate a gate-level netlist of the circuit design, for example using gates from a particular library pertaining to a targeted process supported by a foundry, which has been selected to produce the integrated circuit. Alternatively, logic synthesis and optimization tools 474 may generate a gate-level netlist of the circuit design using gates of a targeted programmable logic device (i.e., in the logic and interconnect resources of a particular programmable logic device product or product family).

Logic synthesis and optimization tools 474 may optimize the design by making appropriate selections of hardware to implement different logic functions in the circuit design based on the circuit design data and constraint data entered by the logic designer using tools 464. As an example, logic synthesis and optimization tools 474 may perform multilevel logic optimization and technology mapping based on the length of a combinational path between registers in the circuit design and corresponding timing constraints that were entered by the logic designer using tools 464.

After logic synthesis and optimization using tools 474, the circuit design system may use tools such as placement, routing, and physical synthesis tools 476 to perform physical design steps (layout synthesis operations). Tools 476 can be used to determine where to place each gate of the gate-level netlist produced by tools 474. For example, if two counters interact with each other, tools 476 may locate these counters in adjacent regions to reduce interconnect delays or to satisfy timing requirements specifying the maximum permitted interconnect delay. Tools 476 create orderly and efficient implementations of circuit designs for any targeted integrated circuit (e.g., for a given programmable integrated circuit such as a field-programmable gate array (FPGA)).

Tools such as tools 474 and 476 may be part of a compiler suite (e.g., part of a suite of compiler tools provided by a programmable logic device vendor). In certain embodiments, tools such as tools 474, 476, and 478 may also include timing analysis tools such as timing estimators. This allows tools 474 and 476 to satisfy performance requirements (e.g., timing requirements) before actually producing the integrated circuit.

After an implementation of the desired circuit design has been generated using tools 476, the implementation of the design may be analyzed and tested using analysis tools 478. For example, analysis tools 478 may include timing analysis tools, power analysis tools, or formal verification tools, just to name few.

After satisfactory optimization operations have been completed using tools 420 and depending on the targeted integrated circuit technology, tools 420 may produce a mask-level layout description of the integrated circuit or configuration data for programming the programmable logic device.

Figure 5:
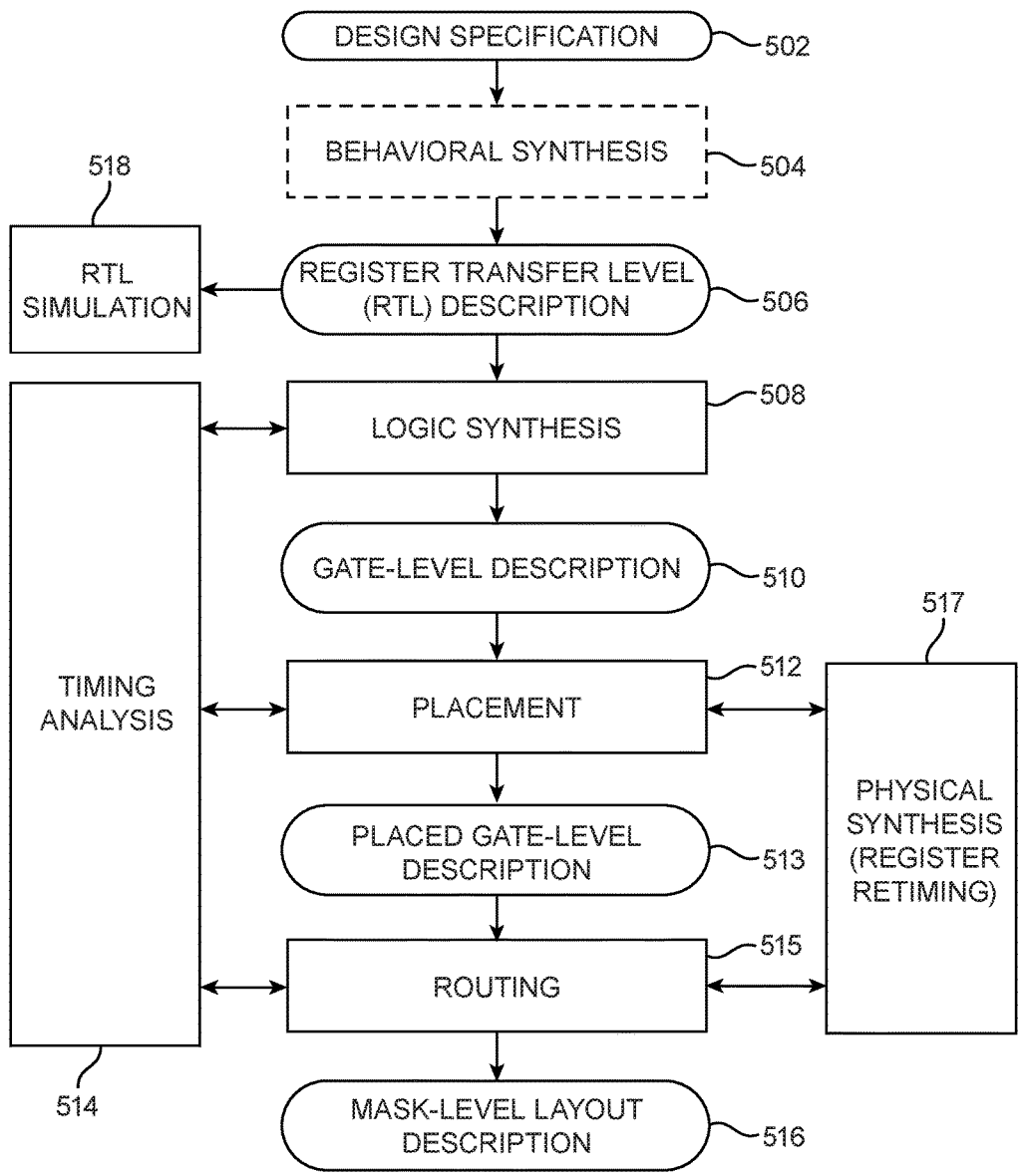
FIG. 5 is a flow chart of illustrative steps for designing an integrated circuit in accordance with an embodiment.

Illustrative operations involved in using tools 420 of FIG. 4 to produce the mask-level layout description of the integrated circuit are shown in FIG. 5. As shown in FIG. 5, a circuit designer may first provide a design specification 502. The design specification 502 may, in general, be a behavioral description provided in the form of an application code (e.g., C code, C++ code, SystemC code, OpenCL code, etc.). In some scenarios, the design specification may be provided in the form of a register transfer level (RTL) description 506.

The RTL description may have any form of describing circuit functions at the register transfer level. For example, the RTL description may be provided using a hardware description language such as the Verilog hardware description language (Verilog HDL or Verilog), the SystemVerilog hardware description language (SystemVerilog HDL or SystemVerilog), or the Very High Speed Integrated Circuit Hardware Description Language (VHDL). If desired, a portion or all of the RTL description may be provided as a schematic representation or in the form of a code using OpenCL, MATLAB, Simulink, or other high-level synthesis (HLS) language.

In general, the behavioral design specification 502 may include untimed or partially timed functional code (i.e., the application code does not describe cycle-by-cycle hardware behavior), whereas the RTL description 506 may include a fully timed design description that details the cycle-by-cycle behavior of the circuit at the register transfer level.

Design specification 502 or RTL description 506 may also include target criteria such as area use, power consumption, delay minimization, clock frequency optimization, or any combination thereof. The optimization constraints and target criteria may be collectively referred to as constraints.

Those constraints can be provided for individual data paths, portions of individual data paths, portions of a design, or for the entire design. For example, the constraints may be provided with the design specification 502, the RTL description 506 (e.g., as a pragma or as an assertion), in a constraint file, or through user input (e.g., using the design and constraint entry tools 464 of FIG. 4), to name a few.

At step 504, behavioral synthesis (sometimes also referred to as algorithmic synthesis) may be performed to convert the behavioral description into an RTL description 506. Step 504 may be skipped if the design specification is already provided in form of an RTL description.

At step 518, behavioral simulation tools 472 may perform an RTL simulation of the RTL description, which may verify the functionality of the RTL description. If the functionality of the RTL description is incomplete or incorrect, the circuit designer can make changes to the HDL code (as an example). During RTL simulation 518, actual results obtained from simulating the behavior of the RTL description may be compared with expected results.

During step 506, logic synthesis operations may generate gate-level description 510 using logic synthesis and optimization tools 474 from FIG. 4. The output of logic synthesis 508 is gate-level description 510.

During step 512, placement operations using for example placement tools 476 of FIG. 4 may place the different gates in gate-level description 510 in a preferred location on the targeted integrated circuit to meet given target criteria (e.g., minimize area and maximize routing efficiency or minimize path delay and maximize clock frequency or minimize overlap between logic elements, or any combination thereof). The output of placement 512 is placed gate-level description 513, which satisfies the legal placement constraints of the underlying target device.

During step 515, routing operations using for example routing tools 476 of FIG. 4 may connect the gates from the placed gate-level description 513. Routing operations may attempt to meet given target criteria (e.g., minimize congestion, minimize path delay and maximize clock frequency or any combination thereof). The output of routing 515 is a mask-level layout description 516 (sometimes referred to as routed gate-level description 516).

While placement and routing is being performed at steps 512 and 515, physical synthesis operations 517 may be concurrently performed to further modify and optimize the circuit design (e.g., using physical synthesis tools 476 of FIG. 4). If desired, register retiming operations may be performed during physical synthesis step 517. For example, registers in the placed gate-level description 513 or the routed gate-level description 516 may be moved around according to the constraints that are included in design specification 502 or RTL description 506.

Design systems may optimize the logic design by making appropriate selections of hardware to implement different logic functions in the circuit design based on the circuit design data and constraint data entered by the logic designer. Tools (such as tools 474 of FIG. 4) may optimize the design while ensuring that device constraints are satisfied. Such device constraints may include legality rules (sometimes referred to herein as legality constraints). The legality rules may specify what placement of logic elements within the design and what interconnections are legal or illegal (e.g., which placements and interconnections satisfy or do not satisfy the legality rules).

Examples of legality constraints that may be imposed include rules about where certain logic elements can be placed, rules dictating that multiple elements cannot share a single location on the design, clustering rules, rules dictating how elements can be connected, clocking rules (e.g., constraints on how each logic element in the design is clocked or how many clocks each logic cluster may receive), packing rules, or other desired legality constraints. In particular, legality constraints may include overlap rules (e.g., overlap constraints) that require no overlap between a given element and elements adjacent to the given element within a logic design. As an example, prior to enforcing the overlap rules (e.g., earlier in a design flow), the overlap between the given element and the elements adjacent to the given element may be first minimized to accommodate for other logic design metrics (e.g., wiring usage, routing congestion, timing, etc.). Later in the design flow, the other logic design metrics may be relaxed and optimized to achieve the overlap rules (e.g., to achieve no overlap).

Figure 6:
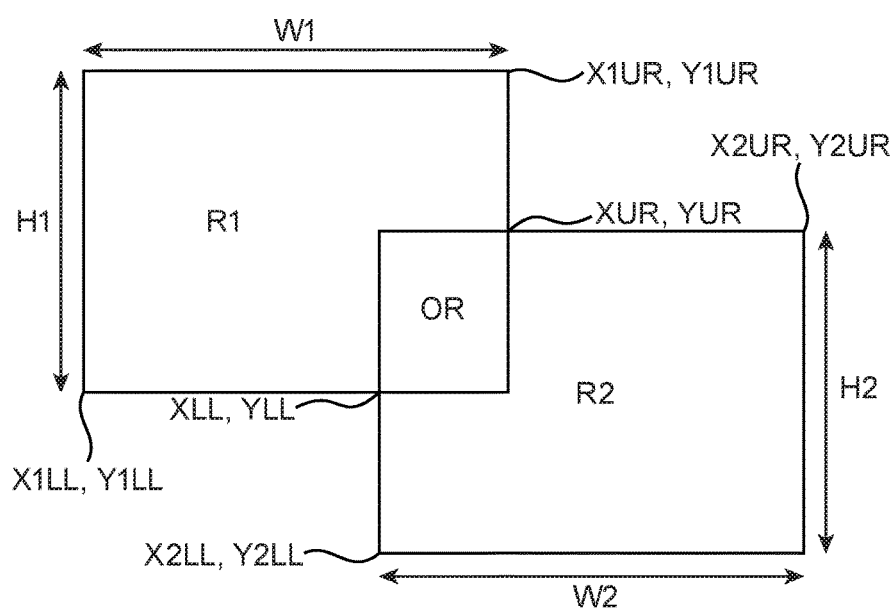
FIG. 6 is a diagram of two illustrative rectangular logic regions that include an exemplary overlapping region in accordance with an embodiment.

FIG. 6 is a diagram showing how two logic regions in a logic design for an integrated circuit can have an overlapping region. By minimizing the area of the overlapping region, overlap of the logic regions may be minimized to optimize performance of the integrated circuit.

As shown in FIG. 6, a first rectangular logic or circuitry region R1 and a second rectangular logic or circuitry region R2 may be defined. First logic region R1 may overlap second region R2 at an overlap region CR (e.g., a region on the floorplan of integrated circuit 10 that is shared by both logic regions R1 and R2).

Rectangular regions R1 and R2 may, for example, represent two logic elements within integrated circuit 10 (e.g., regions R1 and R2 may model two logic elements themselves). In another example, regions R1 and R2 may be two separate sub-circuits to be placed within integrated circuit 10 (e.g., during placement step 512 of FIG. 5). These examples are merely illustrative. If desired, rectangular regions R1 and R2 may represent any two separate portions of logic circuitry. When generating the optimal logic design for device 10, system 156 may minimize the size of overlap region OR or may eliminate region OR. This may minimize or eliminate the overlap between regions R1 and R2, thereby optimizing the final design for implementation on logic device 10.

Logic system 156 may use a coordinate system to define the relative positioning of regions R1 and R2. For example, as shown in FIG. 6, rectangular region R1 may be defined by the point (X1LL,Y1LL) at the lower left corner of region R1 and the point (X1UR,Y1UR) at the upper right corner of region R1. Similarly, rectangular region R2 may be defined by the point (X2LL,X2LL) at the lower left corner of region R2 and the point (X2UR,Y2UR) at the upper right corner of region R2. The points (X1LL,Y1LL), (X1UR,Y1UR), (X2LL,Y2LL), and (X2UR,Y2UR) may represent x-y coordinates within a Cartesian plane, for example. In other words, these coordinates may be in the form of point (x,y), where x and y are real numbers (e.g., −1.034, 43, etc.). However, this is merely illustrative. If desired, any desired coordinate system may be used to define the relative positioning of regions R1 and R2. For example, polar coordinate planes, or three-dimensional coordinate planes may be used if desired.

As shown in FIG. 6, overlap region OR may be a rectangle defined by points (XUR,YUR) at the upper right corner of region OR and (XLL,YLL) at the lower left corner of region OR. Since two-dimensional regions R1, R2, and OR are rectangular (e.g., have fixed lengths and widths), they are fully defined using the coordinates at their respective upper right and lower left corners. In other words, there is a one-to-one mapping of a particular rectangular region and its particular definition (e.g., using the upper right and left corner coordinates). If desired, other methods of fully defining regions R1, R2, and OR may be used. For example, region R1 may be defined by its particular width, length, and the coordinates of one of its corners. If desired, one or more of rectangles R1, R2, and OR may be defined by the coordinates of their upper left and lower right corners.

Using these definitions of regions R1 and R2 (e.g., using the respective upper left and lower right corner coordinates), the width of region R1 (e.g., W1) may be given by the equation W1=X1UR−X1LL. The height of region R1 (e.g., height H1) may be given by the equation H1=Y1UR−Y1LL. Similarly, the width of region R2 (e.g., W2) may be given by the equation W2=X2UR−X2LL. The height of region R2 (e.g., height H2) may be given by the equation H2=Y2UR−Y2LL.

Some properties of regions R1 and R2 may be fixed. For example, widths W1 and W2, and heights H1 and H2 may be fixed by physical constraints (e.g., the physical size of the modeled logic elements or the modeled circuitry). These fixed properties may be referred to herein as fixed constraints. In contrast, the points (X1LL,Y1LL), (X1UR,Y1UR), (X2LL,Y2LL), and (X2UR,Y2UR), may be unfixed (e.g., variable, changing). These changing variables may be referred to herein as adjustable variables.

Furthermore, using the definitions of regions R1 and R2, the upper right and lower left coordinates of overlap region OR may be specified using relationships XLL=Max(X1LL, X2LL), XUR=Min(X1UR, X2UR), YLL=Max(Y1LL, Y2LL), and YUR=Min(Y1UR, Y2UR). Operator Max(a, b) (sometimes referred to herein as the Max operator or Max function) may be a maximum operator that outputs the larger one of its inputs a and b. For example, the operation Max(10,100) would output the value "100" whereas the operation Max(10,1) would output the value "10." Operator Min(a, b) (sometimes referred to herein as the Min operator or Min function) may be a minimum operator that outputs the smaller one of its inputs a and b.

As specified, coordinates of region OR (e.g., the points (XUR,YUR) and (XLL,YLL)) are outputs of the Max and Min operators XLL=Max(X1LL, X2LL), XUR=Min (X1UR, X2UR), YLL=Max(Y1LL, Y2LL), and YUR=Min (Y1UR, Y2UR). Because the inputs to the Max and Min operators are adjustable variables, coordinates of region OR (e.g., the points (XUR,YUR) and (XLL,YLL) may also be adjustable variables. Defined in such a way, the points (XUR,YUR) and (XLL,YLL) may be constrained (e.g., set to zero, minimized) to achieve the goal of minimizing or removing overlap region OR. In other words, a width variable (e.g., XLL−XUR) and a height variable (e.g., YLL−YUR) of overlap region OR may be minimized. Minimization may be achieved using a cost function that includes fixed constraints and adjustable variables. A cost function may have an output value that can be set to meet a pre-determined target (e.g., an output value that seeks to be minimized). By adjusting the adjustable variables, the pre-determined goal may be met.

For example, the constraint may be set using a cost function defined by the equation OverlapCostofR1withR2=Min(1, Min(Max(XUR−XLL,0), Max(YUR−YLL,0))). This cost function may sometimes be referred to herein as the overlap cost function. The operation of the overlap cost function may be described as follows. The overlap cost function may compare values XUR−XLL and "0" and use the greater of the two to generate an X cost. The overlap cost function may also compare values YUR−YLL and "0" and use the greater of the two to generate a Y cost. The overlap cost function may compare the X cost to the Y cost to generate a minimized cost equal to the smaller of the X cost and the Y cost. The minimized cost may then be compared to the value "1". The overlap cost function may generate an output that is the smaller value of either 1 or the minimized cost.

The output value of the overlap cost function may be "1" if an overlap exists between R1 and R2 (e.g., if a non-zero region OR exists). The output value of the overlap cost function may be "0" if no overlap exists between R1 and R2 (e.g., region OR does not exist or has an area of zero). The adjustable variables within the overlap cost function may be varied until the output value of the overlap cost function is zero to minimize overlap.

In this scenario, the points (X1LL,Y1LL), (X1UR, Y1UR), (X2LL,Y2LL), (X2UR,Y2UR), (XUR,YUR), and (XLL,YLL) may all be adjustable variables. Widths W1 and W2, and heights H1 and H2 may be fixed constraints (e.g., fixed values).

In order to achieve to the goal of minimizing overlap, the overlap cost function may be minimized using a solver engine (e.g., constrained solver software, solver engine 157 of FIG. 2). Solver 157 may utilize convex optimization techniques to minimize the overlap cost function, for example. The convex optimization techniques may be used because a function that subtracts an output of a Min function from an output of a Max function may be a convex function. A function (e.g., a curve defined by the function) may be a convex function if a line drawn between any two points on the curve lies above or on the curve. In such a scenario, there is no more than one minimum point for the function that is convex. The minimum point may be found by using convex smoothening techniques (e.g., differential analysis of the function, smoothening out the curve, etc.).

In other words, solver 157 may attempt to input different values for the points (XUR,YUR) and (XLL,YLL), and consequently coordinates of regions R1 and R2 (e.g., the points (X1LL,Y1LL), (X1UR,Y1UR), (X2LL,Y2LL), and (X2UR,Y2UR)) to the overlap cost function in an attempt to minimize the overlap cost function. In particular, the optimal solution of the overlap cost function (e.g., a solution to minimize or remove overlap region OR) may include the coordinates defining regions R1 and R2 (e.g., defining how regions R1 and R2 are to be implemented on the floorplan of device 10). One or more optimal solutions may satisfy an overlap cost criteria (e.g., criteria of a suitable amount of overlap or criteria of no overlap). For example, more than one set of coordinates for regions R1 and R2 may remove region OR, one solution may completely remove region OR, no solution may completely remove region OR, etc. As another example, more than one set of coordinates for regions R1 and R2 may minimize region OR, one solution may minimize region OR, no solution may minimize region OR, etc.

Additional constraints may be used as inputs for the overlap cost function if desired. For example, the coordinates of region R2 may be fixed (e.g., the points (X2LL, Y2LL) and (X2UR,Y2UR) may be fixed constraints instead of adjustable variables). In this scenario, coordinates (X1LL, Y1LL), (X1UR,Y1UR), (XUR,YUR), and (XLL,YLL) may all be adjustable variables. Widths W1 and W2, heights H1 and H2, and coordinates (X2LL,Y2LL), (X2UR,Y2UR), may be fixed constraints.

The coordinates of region R2 may be fixed because the circuitry that defines region R2 is required (e.g., required to serve a particular purpose, by design, etc.) to be at a certain fixed location. This is merely illustrative. If desired, the fixed coordinates of region R2 may be used to simulate region R2 as a placement blockage (e.g., circuitry fixed in place such that other circuitry may not occupy the same space) in integrated circuit designs. If desired, the fixed coordinates of region R2 may be used to model region R2 as any other type of fixed location circuitry.

The example of FIG. 6 in which the overlap cost function is used to minimize overlap between regions of logic for device 10 is merely illustrative. In general, the overlap cost function may be used to minimize overlap between any rectangular regions defined in any desired manner.

Figure 7:
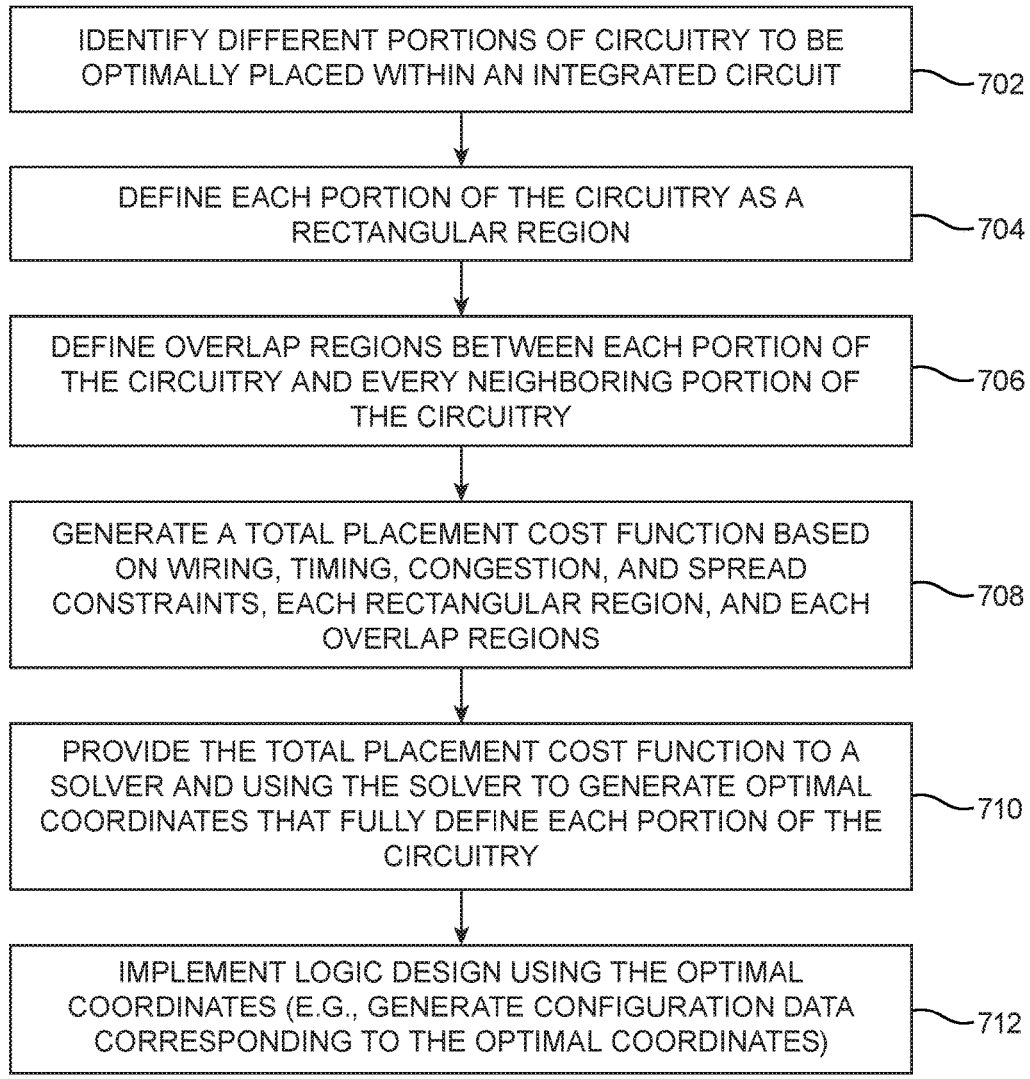
FIG. 7 is a flow chart showing illustrative steps for minimizing overlapping regions between separate circuitry in implementing a logic design on an integrated circuit in accordance with an embodiment.

As described previously, an integrated circuit may include a large amount of circuitry (e.g., a large number of logic elements). FIG. 7 is a flow chart of illustrative steps that may be performed by logic design system 156 to minimize the overlap between any two adjacent pairs of circuitry (e.g., logic circuitry) within the integrated circuit.

At step 702, system 156 may identify different portions of circuitry (e.g., each functionally different circuit, each logic element, each sub-section of each logic element, each functional block, each sub-section of each functional block, any combination thereof, etc.) to be optimally placed (e.g., placed with minimal overlap between the different portions of the circuitry).

At step 704, system 156 may specify (e.g., define, model, approximate, etc.) each different portion of circuitry as rectangular regions such as region R1 or R2 in FIG. 6. These circuitry portions may be defined using any method such as the methods previously discussed in connection to FIG. 6. In particular, the circuitry portions may be defined by the coordinates of their upper right and lower left corners. Alternatively, they may be defined by the coordinates of their lower right and upper left corners. If desired, any parameters may be used to fully define each rectangular region.

Each circuitry portion may have one or more adjacent circuitry portions defined by their corresponding rectangular regions. Each circuitry portion may form an adjacent pair with every one of its corresponding adjacent circuitry portions. In other words, each circuitry portion may be included in one or more adjacent pairs. Each circuitry portion pair may form a potential overlap region. For example, region R1 in FIG. 6 may have more than one adjacent region. In addition to region R2 in FIG. 6, region R1 may neighbor another rectangular region and potentially form another corresponding overlap region. As an example, there may be yet another rectangular region that potentially forms yet another corresponding overlap region with region R1.

In addition, some circuitry portions may have fixed coordinates (e.g., coordinates that are fixed constraints), while other circuitry portions may have unfixed coordinates (e.g., coordinates that are adjustable variables).

At step 706, system 156 may specify each overlap region for every adjacent pair using any method such as the methods discussed in connection with FIG. 6. For example, the coordinates of the upper right and lower left corners of each overlap region OR may be defined. However, this is merely illustrative. If desired, any other methodology may be used to fully specify (e.g., fully define) each overlap region.

At step 708, system 156 may generate an overlap cost function for each adjacent pair. A total overlap cost function may be calculated by combining (e.g., summing) each of the overlap cost functions for each adjacent pair if desired.

The total overlap cost function may be combined with other cos, functions to optimize global placement for the integrated circuit. The global placement may be optimized for wire length, operating frequency, congestion, overlap (sometimes referred to herein as spread), or any combination thereof using scaling constants. For example, an exemplary global placement cost function may be GlobalPlacementCostFunction=$\Sigma_i$WireCostFunction($x_i$)+$\Sigma_i \alpha_i$TimingCostFunction($x_i$)+$\Sigma_i \beta_i$CongestionCostFunction($x_i$)+$\Sigma_i \gamma_i$OverlapCostFunction($x_i$).

In the exemplary global placement cost function, the $\Sigma_i$WireCostFunction($x_i$) term denotes a cost function associated with the wiring (e.g., associated with the total length of wire between circuitry within the integrated circuit). An optimized placement for the circuitry within the integrated circuit may seek to minimize the amount of wiring used. The $\Sigma_i \alpha_i$TimingCostFunction($x_i$) term denotes a cost function associated with the timing (e.g., associated with an inverse of operating frequency for the integrated circuit). An optimized placement for the circuitry within the integrated circuit may seek to minimize the timing, thereby increasing the operating frequency, of the integrated circuit. The $\Sigma_i \beta_i$CongestionCostFunction($x_i$) term denotes a cost function associated with the routing between the circuitry within the integrated circuit (i.e., the congestion of the integrated circuit). An optimized placement for the circuitry within the integrated circuit may seek to minimize the congestion of the circuitry. The $\Sigma_i \gamma_i$OverlapCostFunction($x_i$) term (sometimes shown as $\Sigma_i \gamma_i$SpreadCostFunction($x_i$)) denotes a cost function associated with having overlap or spread between the circuitry within the integrated circuit (e.g., one or more portions of the circuitry may overlap with one another, or no portion of the circuitry may overlap with one another). An optimized placement for the circuitry within the integrated circuit may seek to minimize or remove the overlap between the circuitry.

Each of the cost function terms may be associated with the entire circuitry within the programmable logic region of integrated circuit 10. Alternatively, each of the cost function terms may be associated with only a suitable portion of circuitry (e.g., a subset of the all the circuitry) being configured (or reconfigured). In either example, each cost function term (e.g., the wiring cost function, timing cost function, congestion cost function, or overlap cost function) may be a summation of unit cost functions. The summation of the unit cost functions may be indicated by the subscript i, that denotes iterating through i number of cells (e.g., circuitry portions). The unit cost functions are calculated for smaller units of the circuitry. For example, the overlap cost function associated with minimizing region OR in FIG. 6 may be a unit overlap cost function. Similarly, a unit wiring cost function may be calculated for circuitry portions defined by regions R1 and R2.

Each unit cost function of each type of cost function may be scaled relative to one another using scaling constants $\alpha_i$, $\beta_i$, and $\gamma_i$. Scaling constants $\alpha_i$, $\beta_i$, and $\gamma_i$ may be relative to the unity scaling of each unit wiring cost function term (i.e., scaling each unit wiring cost function term by one).

The scaling constants of the global placement cost function nay be chosen to reflect the suitable design or to meet certain engineering criteria. A larger scaling constant increases the importance of minimizing the corresponding term. This is because if the corresponding cost function is non-zero, all things equal for each of the other terms, the scaled cost function may be very large and overwhelm all of the terms. As a result, to minimize the overall cost function, it may be imperative to find a scenario in which the corresponding cost function may be zero.

In other words, if wiring is considered to be the most important factor during placement, scaling constants $\alpha_i$, $\beta_i$, and $\gamma_i$ may all be less than unity. The smaller the scaling constants $\alpha_i$, $\beta_i$, and $\gamma_i$ may be, the more important the wiring cost function term becomes. Alternatively, if it is essential that overlap be minimized or completely removed during placement, the scaling constant $\gamma_i$ may be larger than unity and larger than scaling constants $\alpha_i$, and $\beta_i$. These examples are merely illustrative. If desired, one or more unit or total cost function terms may be emphasized with suitable scaling constants $\alpha_i$, $\beta_i$, and $\gamma_i$.

Additional terms with additional corresponding scaling constants may be added to the global placement cost function. In addition, some terms may be omitted from the global placement cost function as previously discussed.

At step 710, system 156 may provide the complete global placement cost function having desired terms with suitable scaling constants to a solver (e.g., constrained solver software or any other type of solver, solver 157 of FIG. 2). Solver engine 157 may provide optimized solutions that minimize the complete global placement cost function. The minimization may be accomplished through using an incremental algorithm, where output values are continuously generated until the output values converge (e.g., meet a pre-determined criteria). The optimized solution may provide an output value (e.g., the minimum value) of the complete global placement cost function. Additionally, the solution may provide a set of values for each of the coordinates that fully defines each rectangular region. Consequently, each circuitry portion may be placed using the set of values for coordinates that fully define each circuitry portion. The coordinates used for placement are optimal coordinates with respect to minimizing or removing overlap (e.g., overlap region OR). In other words, when each circuitry portion is placed on a floorplan of integrated circuit 10, the floorplan will have a minimal amount of overlap between the circuitry portions.

At step 712, system 156 may implement the placement of the circuitry portion (e.g., logic elements, functional blocks, or subset of circuits, etc.) at optimal locations in the logic design. In other words, system 156 may generate configuration data to configure these circuitry portions for placement at optimal locations. The generated configuration data may then be used to configure the integrated circuit (e.g., using equipment 154 and/or configuration device 141).

Figure 8:
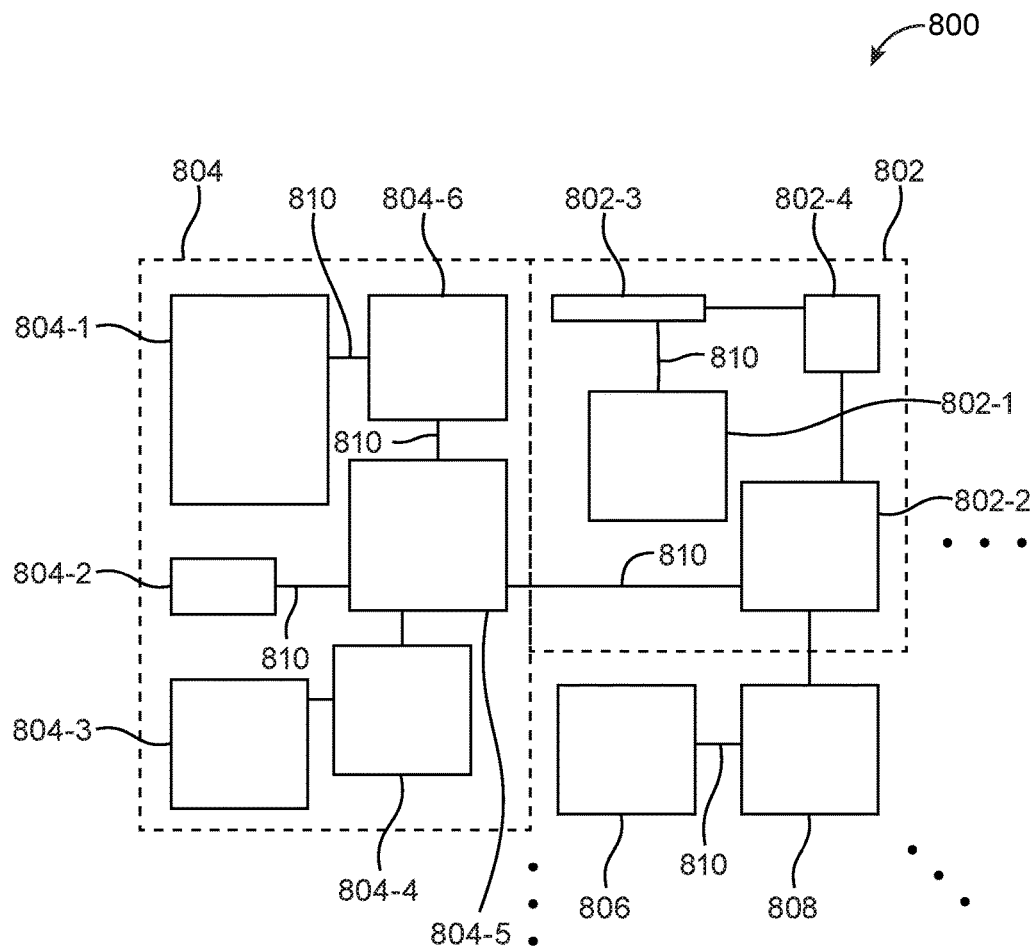
FIG. 8 is a diagram of an illustrative logic design within an integrated circuit which includes rectangular regions of circuitry cells that are provided with minimal overlap in accordance with an embodiment.

FIG. 8 shows an illustrative logic design 800 implemented within integrated circuit 10 that includes multiple logic elements and internal circuitry, which form circuitry cells. In particular, logic design 800 may include circuitry cells (analogous to circuitry portions referred to previously in FIG. 7) 802-1, 802-2, 802-3, 802-4, 804-1, 804-2, 804-3, 804-4, 804-5, 804-6, 806, and 808. These circuitry cells may include any desirable number of circuits. These circuitry cells may include logic elements. These circuitry cells may include circuits that are programmable (e.g., soft, configurable) or fixed (e.g., hard, unconfigurable). This is merely illustrative.

For example, if desired, circuitry cells may include any suitable circuitry subsections within LABs (such as LAB 110 of FIG. 1), DSP 120 (such as DSP 120 of FIG. 1), RAM (such as RAM 130 of FIG. 1), IOE (such as IOE 102 of FIG. 1), routing circuitry (such as routing channels 140 and 150 of FIG. 1), or any other circuitry within integrated circuit 10. For example, circuitry cells may include transistors, multiplexers, look-up tables, logic arrays, AND, OR, NAND, and NOR logic gates, pass gates, etc. If desired, these circuitry cells may be generated by using CAD tools 420 in FIG. 4 (e.g., using logic synthesis tools).

Because circuitry cells within logic design 800 have not been placed, the particular arrangement in FIG. 8 may be trivial (e.g., the location of any of the circuitry cells may be moved). Prior to or during placement (e.g., placement step 512 in FIG. 5), placement locations of the circuitry cells may be optimized to minimize overlap using methods as discussed in FIGS. 6 and 7. Circuitry cells 802-1, 802-2, 802-3, 802-4, 804-1, 804-2, 804-3, 804-4, 804-5, 804-6, 806, and 808 may each be defined by a rectangular region. Each circuitry cell may be an adjacent circuitry cell to one another. For example, circuitry cell 802-1 may be an adjacent cell to circuitry cell 802-2. The combination of a given circuitry cell and a corresponding adjacent circuitry cell may be referred to herein as an adjacent cell pair. The circuitry cells may be coupled to and communicate with one another using paths 810. Adjacent, circuitry cell pairs may be defined by circuitry cells that communicate with one another.

For example, in FIG. 8, circuitry cell 804-6 may be adjacent to and coupled to circuitry cells 804-1 and 804-5. Circuitry cells 804-1 and 804-6 may form a first adjacent circuitry cell pair, while circuitry cells 804-5 and 804-6 may form a second adjacent circuitry cell pair. For example, circuitry cell 804-5 may be coupled to circuitry cells 802-2, thereby forming a third adjacent circuitry cell pair.

If desired, adjacent circuitry cell pair may be defined when it is suitable to avoid overlap between the adjacent circuitry cell pair. In another example, circuitry cell 806 may be near or in close proximity to circuitry cell 804-4. If desired, circuitry cells 806 and 804-4 may also be an adjacent circuitry cell pair even though the adjacent circuitry cell pair are not directly coupled to each other. In a further example, if circuitry cells 806 and 804-4 may also be another adjacent circuitry cell pair (or simply a cell pair) even though the another adjacent circuitry cell pair is not directly coupled to each other and are not in close proximity with one another. Establishing the another adjacent circuitry cell pair of cells 806 and 804-4 (e.g., the relationship between cells 806 and 804-4) may be useful and necessary, when there may be any possibility of overlap, however improbable. Adjacent circuitry cell pairs may be referred to herein simply as cell pairs because there may be no physical adjacency requirement for cell pairs.

In fact, by introducing every possible cell pair combination within an entire integrated circuit, a most optimal placement of each circuitry cell may be calculated. However, it may be computationally intensive to generate the most optimal placement of each circuitry cell because the number of possible cell pair combinations may be very large (e.g., on a scale of the square of the number of circuitry cells). Therefore, cell pairs may be established within a particular region, such as region 802 for circuitry cell 802-4 and region 804 for circuitry cell 804-2.

In other words, there may be distance restrictions for cell pairs. As an example, circuitry cells are may be considered cell pairs if the distance between the cell pairs is one in arbitrary units defined as by being vertically, horizontally, or diagonally adjacent to a given circuitry cell (e.g., cells 802-4 and 804-2). Using this restriction, only cells 802-1, 802-2, and 802-3 may be considered as forming cell pairs with cell 802-4. Similarly, only cells 804-1, 804-3, 804-4, 804-5, and 804-6 may be considered as forming cell pairs with cell 802-4. This is merely illustrative. If desired, any type of distance restriction may be used. For example, a suitable type of distance restriction may be generated using the Manhattan distance. The distance restrictions may be uniform across logic design 800 within integrated circuit 10. However, if desired, the distance restrictions may be uneven within logic design 800 (i.e., different portions of integrated circuit 10 may have different distance restrictions). The distance restrictions may be received as an input parameter to system 156, as an example.

Alternatively, if the entirety of an integrated circuit has already been roughly (e.g., approximately, non-optimally) placed, smaller regions for placement may be used instead of the entirety of an integrated circuit. For example, if desired, region 802 may be specifically targeted to be optimized to remove or minimize overlap. The computational intensity of such a process will be relatively low, since region 802 includes circuitry cells 802-1, 802-2, 802-3, and 802-4. The four cells may each be modelled as rectangular regions (e.g., regions R1 and R2 in FIG. 6). Therefore, every possible cell pair combination may be established within region 802. Because there are four circuitry cells within region 802, there may be only six unique cell pairs. Cell pairs 802-1 with 802-2 and 802-2 with 802-1 may only count as one unique cell pair. Similarly, region 804 may include six circuitry cells that generate 15 unique cell pairs. This is merely illustrative. If desired, cell pairs may be generated over any suitable region of any suitable size within an integrated circuit. In other words, only a desired portion of the integrated circuit may be optimally placed in terms of overlap.

These methods of selecting (e.g., defining) cell pairs to reduce computational intensity may be used in combination with each other. Additionally, different portions of logic design 800 within integrated circuit 10 may use different methods to define cell pairs.

Using the methods described in FIGS. 6 and 7, a unit overlap cost function related to a corresponding overlap region for each respective cell pair over a specified region for placement (e.g., regions 802 and 804) may be generated. The unit overlap cost functions may be provided to a solver (e.g., solver 157 of FIG. 2). The solver may provide (e.g., output) optimal coordinates (e.g., coordinates that minimize or remove overlap) for each of the circuitry cells within the specified region for placement. For example, the optimal coordinates may be implemented within configuration data. The overlap cost function may be solved in solver engine 157 in conjunction with other types of cost functions (e.g., wiring cost functions, timing cost function, congestion cost functions, etc.). The specifics are omitted as to not obscure the present embodiment.

If desired, some cells within the specific region for placement may be fixed, as discussed in connection with FIG. 6. For example, the location of R2 may be fixed. In other words, these fixed cells have coordinates that are fixed constraints instead of adjustable variables. As an example, circuitry cell 808 may include input/output elements (e.g., input/output columns) that may not be moved. Therefore, the coordinates of circuitry cell 808 may be fixed. As another example, circuitry cell 804-5 may include processor core elements that may not be moved. Therefore, the coordinates of circuitry cell 808 may be fixed. This is merely illustrative. If desired, any cell may be fixed for a suitable reason.

Figure 9:
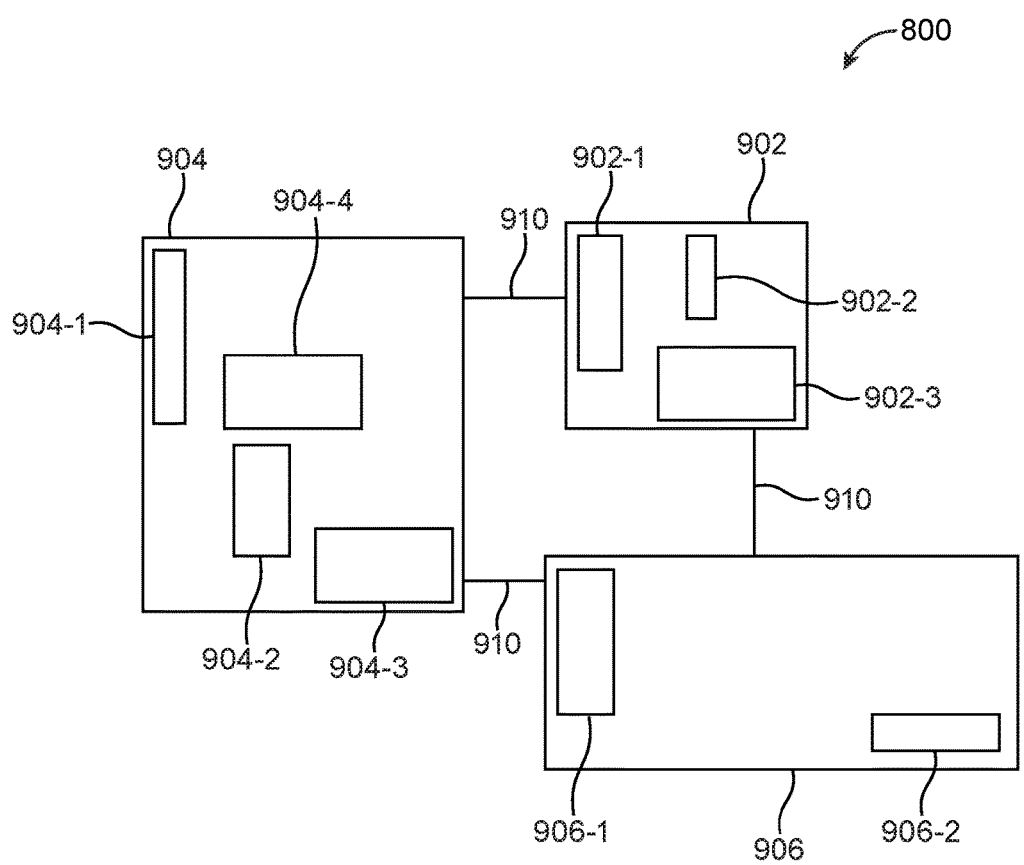
FIG. 9 is a diagram of an illustrative logic design within an integrated circuit which includes rectangular regions of functional blocks that are provided with minimal overlap in accordance with an embodiment.

FIG. 9 shows illustrative logic design 800 to be implemented within integrated circuit 10 that includes multiple floating regions or functional blocks formed by circuitry cells. Each functional block may have circuitry that work together to serve a particular (e.g., specialized) function. Alternatively, floating regions may be specified using other criteria. For example, floating regions may be partially reconfigurable regions. Functional blocks and floating regions may be used interchangeably herein to mean groups of circuitry that have a specialized function (e.g., being partially reconfigurable).

In an example, functional blocks may include one or more LABs (such as LABs 110 of FIG. 1), DSPs 120 (such as DSPs 120 of FIG. 1), RAM (such as RAM 130 of FIG. 1), IOEs (such as IOEs 102 of FIG. 1), routing circuitry (such as routing channels 140 and 150 of FIG. 1), or any other functional blocks within integrated circuit 10. In particular, circuitry block 902 may be formed by circuitry cells 902-1, 902-2, and 902-3. Circuitry block 904 may be formed by circuitry cells 904-1, 904-2, 904-3, and 904-4. Circuitry block 906 may be formed by circuitry cells 906-1 and 906-2.

Functional blocks 902, 904, and 906 may each be defined as a rectangular region (e.g., regions such as R1 and R2 of FIG. 6). Each rectangular region for functional blocks may be defined by peripheral circuitry cells within the corresponding functional block. For example, circuitry cells 902-1 and 902-3 may define the rectangular region of functional block 902, cells 904-1 and 904-3 may define the rectangular region of functional block 904. The placement of each functional block as a whole may be optimized to minimize or remove overlap between functional block pairs. The internal circuitry of each functional block may be hidden (e.g., not considered) while optimizing functional blocks. Alternatively, previous overlap optimization steps may have been taken for the internal circuitry.

Analogous features to FIG. 8 may be present in FIG. 9 unless otherwise specified. Analogous to optimizing placement for circuitry cells in FIG. 8, optimizing placement for functional blocks may first generate function blocks pairs. The functional pairs may introduce potential overlap regions, on which unit overlap cost functions may be based. The unit overlap cost functions for each functional pair (e.g., overlap region for each functional) may be combined and used in combination with other types of cost function to generate a complete cost function with desirable scaling constants.

The complete cost function may be provided to a solver, such as solver circuitry 157, to minimize and generate output coordinates for rectangular regions that define their corresponding functional blocks. The output coordinates may be used to generate the final layout of the logic design for generation of configuration data to implement logic design 800 within integrated circuit 10. The specifics are omitted as to not obscure the present embodiment.

Additional constraints may be present when floating regions are specified as partially reconfigurable regions. Because having overlaps between a partially reconfigurable floating region and another region may be very undesirable, any overlap with the partially reconfigurable floating region may not be present. If desired, the scaling constant for the corresponding overlap cost functions associated with partially reconfigurable floating regions and another floating region may be substantially larger than the scaling constants for any other cost function. This is merely illustrative. If desired, any scaling constants may be used to satisfy predetermined criteria for partially reconfigurable floating region overlap.

Furthermore, floating regions may also include regions that are very costly to overlap. In other words, if any overlap were to occur between these floating regions and another floating region, the associated cost function would be very large and undesirable. For example, floating regions that include input/output column circuitry and hard processor system circuitry may be located in regions that are very costly to overlap. Therefore, it would be desirable to minimize overlap with these types of floating regions using methods previously discussed in FIGS. 6-9. These examples are merely illustrative. If desired, any other suitable floating region circuitry may also minimize overlap in a similar way.

Figure 10:
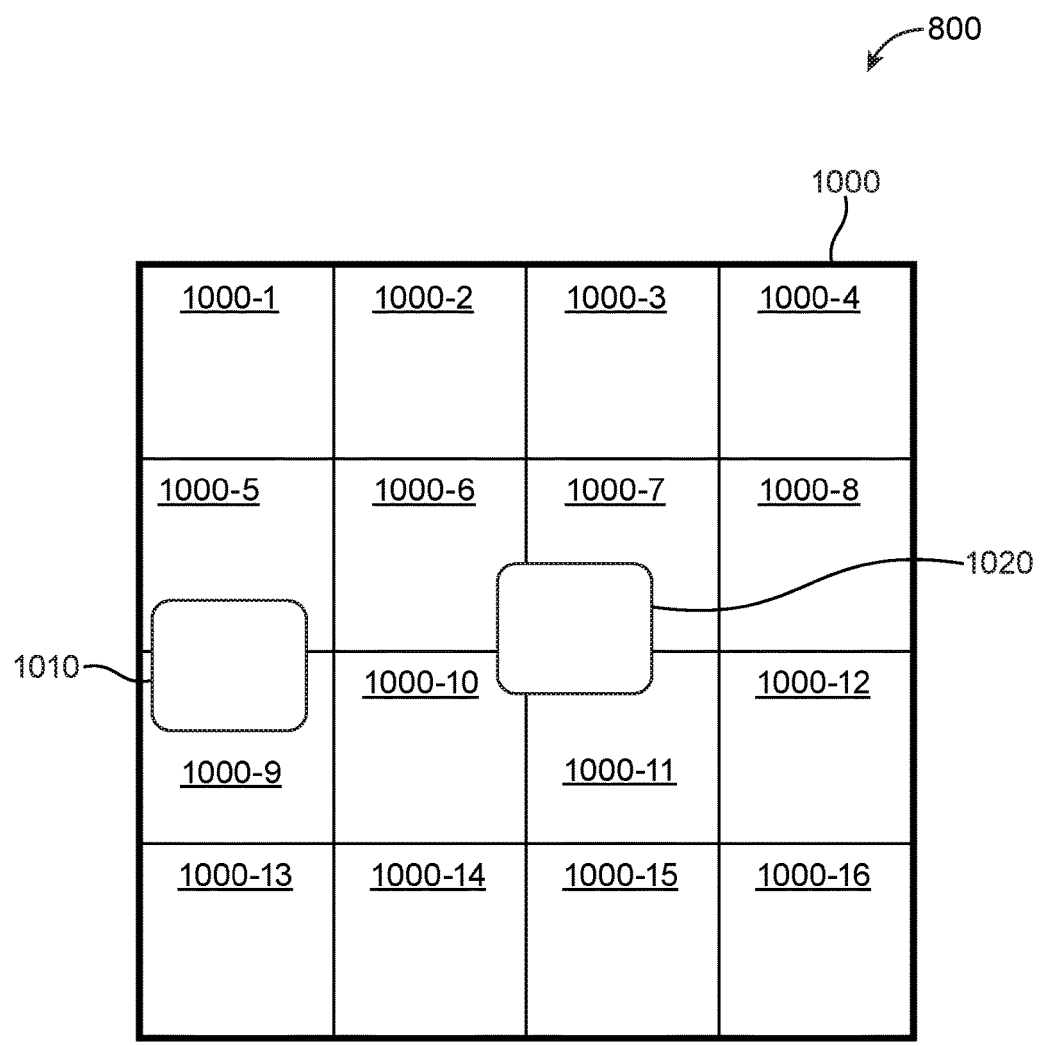
FIG. 10 is a diagram showing how an illustrative integrated circuit may have a grid of sectors that includes different clock regions that overlap with a number of the sectors in accordance with an embodiment.

FIG. 10 shows illustrative logic design 800 within integrated circuit 10 that includes a grid of sectors. The grid of sectors may include circuitry form circuitry cells or floating regions. In particular, grid 1000 (sometimes referred to herein as sector grid 1000) may include sectors 1000-1 to 1000-16. Each sector may include a limited number of clock signals (e.g., a limited number of clock resources) that are used to drive the logic design (i.e., a maximum allowed clock usage of the limited number of clock signals). Clock regions 1010 and 1020 may include clock circuitry that requires clock signals from sectors within grid 1000. In an example, a given clock region may use all of the limited amount of clock resources of an overlapped sector (e.g., a sector that overlaps the given clock region). Clock regions 1010 and 1020 may include latch circuitry, flip-flops, etc. In particular, a group of flip-flops may define boundaries of a bounded rectangular region (e.g., a rectangular clock region). However, regions 1010 and 1020 may occupy (e.g., use) space within multiple sectors (e.g., more than an optimal number of sectors) within grid 1000. By occupying a larger number of sectors, clock regions 1010 and 1020 may use a large amount of limited clock resources associated with each of the occupied sectors. In other words, it would be desirable to minimize the number of sectors that regions 1010 and 1020 each overlap with because the sectors overlapped by regions 1010 and 1020 will only occupy resources of a minimal number of sectors it overlaps as opposed to inefficiently and wastefully occupying more than the minimal number of sectors.

As shown in in FIG. 10, regions 1010 and 1020 overlap with a total of six sectors (e.g., sectors 1000-5 to 1000-7 and sectors 1000-9 to 100-11). However, the methods as discussed in FIG. 6 may be used to optimize the placement of regions 1010 and 1020.

Each clock region may be defined as a clock rectangular region (e.g., a region similar to a logic rectangular region such as region R1 of FIG. 6). Circuitry within each clock region (e.g., flip-flop circuitry) may define the borders or peripheral edges of the clock rectangular region. Each sector may be defined as a sector rectangular region (e.g., a region similar to a logic rectangular region such as region R2 of FIG. 6 that is adjacent to region R1 of FIG. 6). Each clock rectangular region and each sector rectangular region may form a cell pair (e.g., a pair of regions, a pair of two regions).

For example, rectangular regions corresponding to clock region 1010 and sector 1000-1 may form a first pair of regions, rectangular regions corresponding to clock region 1010 and sector 1000-2 may form a second pair of regions, rectangular regions corresponding to clock region 1010 and sector 1000-3 may form a third pair of regions, etc. As another example, rectangular regions corresponding to clock region 1020 and sector 1000-1 may form a first pair of regions, rectangular regions corresponding to clock region 1020 and sector 1000-2 may form a second pair of regions, rectangular regions corresponding to clock region 1020 and sector 1000-3 may form a third pair of regions, etc. The number of clock regions is merely illustrative. Similarly, the number of sectors is merely illustrative. If desired, any number of minimum clock usage sectors or clock regions may be implemented.

The multiple pairs of regions may introduce potential overlap regions (e.g., overlap region OR in FIG. 6), based on which unit overlap cost functions may be generated. The unit overlap cost functions for each functional pair (e.g., overlap region for each functional) nay be combined and used in combination with other types of cost function to generate a complete cost function with desirable scaling constants. The complete cost function may be provided to a solver (e.g., solver circuitry 157 of FIG. 2) to minimize and generate output coordinates for rectangular regions that define their corresponding clock regions with respect to sectors. The output coordinates may be conveyed as configuration data to be implemented within integrated circuit 10. The specifics are omitted as to not obscure the present embodiment.

FIG. 10 shows two clock regions and sixteen sectors. A two-pair combination between clock regions and sectors may produce 32 unique combinations. Therefore, the complete overlap cost function may include unit overlap cost functions from 32 pairs of regions, and consequently 32 potential overlap regions. When the complete overlap cost function associated with FIG. 10 is solved, a given solution with the coordinates of clock regions 1010 and 1020 relative to grid 1000 may be generated. The given solution may have a cost value from the complete overlap cost function that is lower than a cost value from the complete cost function associated with the configuration of clock regions 1010 and 1020 within logic design 800 as originally shown in FIG. 10. Thus, the given solution may be more optimal in terms of at least overlap minimization than the original configuration in FIG. 10.

Figure 11:
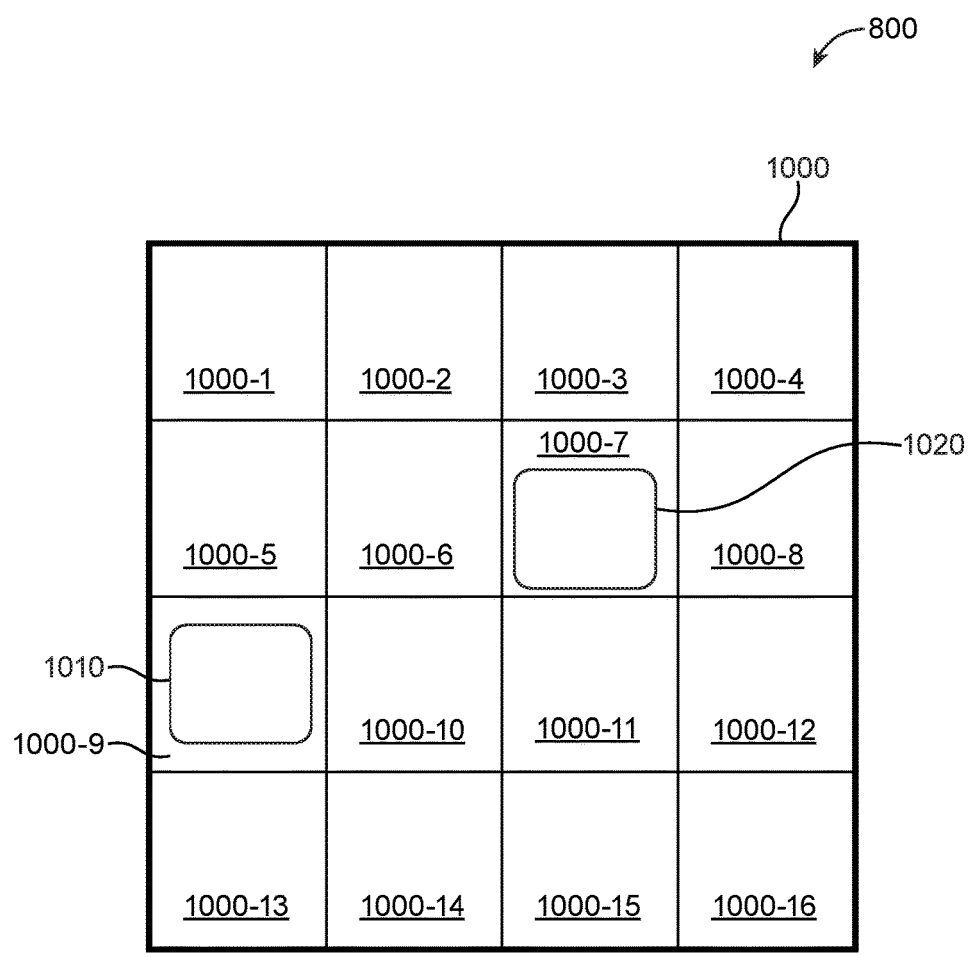
FIG. 11 is a diagram of showing how an illustrative integrated circuit may have a grid of sectors that includes different clock regions that are placed by minimizing a number of overlapped sectors in accordance with an embodiment.

FIG. 11 shows illustrative logic design 800 implemented within integrated circuit 10 that includes clock regions at optimal coordinates that minimize a number of overlapped sectors within grid 1000. Clock region 1010 may be fully placed within sector 1000-9. Clock region 1020 may be fully placed within sector 1000-7. This is merely illustrative. If desired, other optimal solutions may be implemented in the logic design of integrated circuit 10. For example, clock region 1010 may be fully placed within sector 1000-10 and clock region 1020 may be fully placed within sector 1000-6.

While minimizing overlap associated with pairs of circuitry cells or floating regions, complete non-overlap may be achieved. In contrast, overlap between a clock region and a sector may only be minimized because the clock region (e.g., clock region 1010 or 1020) may be necessarily placed within at least one sector. As another example, a given clock regions may be large enough to require overlapping at least two sectors when optimally placed. This is merely illustrative. Clock region placement may require overlapping any number of sectors. The process of minimizing overlap may allow an optimal (e.g., overlapping with a minimal number of used sectors or using a minimum amount of clock resources associated with the overlapped sectors) placement of the clock region within the sectors.

Circuitry cells, functional blocks, sectors within a grid, clock regions, and any other circuitry within integrated circuit 10 may be referred to as hardware resources within integrated circuit 10. Different hardware resources may require different constraints and variables in utilizing minimization overlap as described in FIG. 6. However, hardware resources may be currently optimally placed (during placement) by minimizing or removing overlap. The embodiments of FIGS. 6-11 may be used simultaneously and in combination if desired. Some methods and embodiments described in FIGS. 6-11 may be omitted or changed as desired in optimally place and route hardware resources within an integrated circuit.

Figure 12:
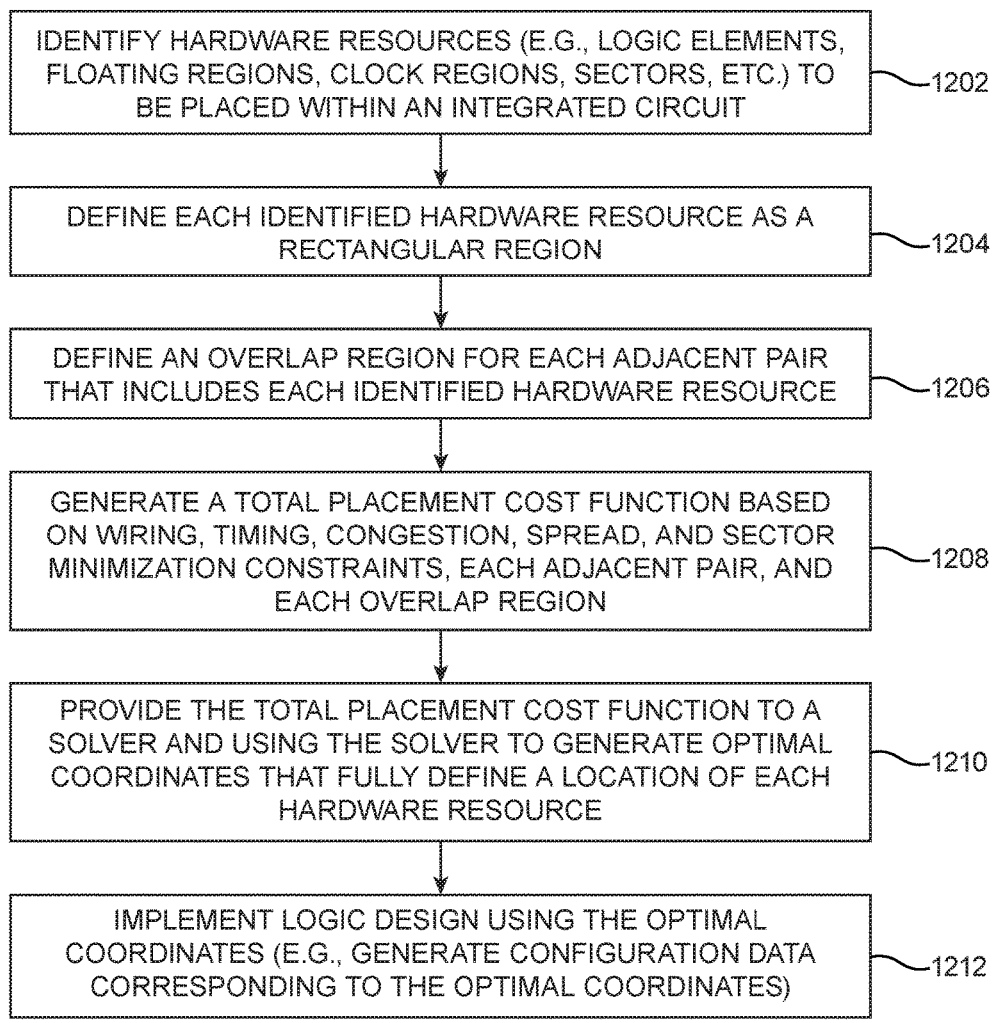
FIG. 12 is a flow chart showing illustrative steps that may be performed by a logic design system for minimizing overlapping regions when implementing different hardware resources within an integrated circuit in accordance with an embodiment.

FIG. 12 show illustrative steps for minimizing overlap regions when implementing different hardware resources within an integrated circuit.

At step 1202, system 156 may identify hardware resources (e.g., logic elements, floating regions, clock regions sectors, etc.) to be placed within an integrated circuit (e.g., integrated circuit 10). For example, all hardware resources within the integrated circuit using the embodiments of FIGS. 8-11 may be identified during step 1202. In particular, circuitry cells, floating regions, and clock regions within a grid of sectors may all be identified as hardware resources (e.g., different types of hardware resources) and simultaneously optimized to minimize or remove overlap.

At step 1204, system 156 may define (e.g., specify, model, etc.) each identified hardware resource as a rectangular region. Each hardware resource may be identified as a corresponding rectangular region. Each type of hardware resource may use different methods to define the corresponding rectangular region. For example, a floating region may be defined as a floating rectangular region using circuit elements at the peripheral of the floating region. In another example, a grid of sectors may define each individual sector as a sector rectangular region. In a further example, a clock region may be defined as a clock rectangular region.

At step 1206, system 156 may define (e.g., specify, model, etc.) an overlap region for each adjacent pair that includes each identified hardware resource. Each hardware resource may be paired with adjacent hardware resources to defined hardware resource pairs. An overlap region may be associated with each unique hardware resource pair. Each type of hardware resource may use different methods to define the hardware resource pair. For example, a pair of logic elements (e.g., logic circuitry cell 802-4 with logic circuitry cell 802-2) may be defined by their proximity to each other. In another example, a floating region pair (e.g., floating regions 902 and 904) may be defined also by their proximity to each other. In another example, a pair between a clock region (e.g., clock region 1010 or clock region 1020) and a sector within a grid (e.g., sectors 1000-16 to 1000-16) may be defined using every possible clock region and sector combination (e.g., region 1010 with sector 1000-1, region 1010 with sector 1000-2, . . . , region 1010 with sector 1000-16, and similarly with region 1020). However, overlap regions for each type of pair may be similarly defined as described in FIGS. 6 and 7.

At step 1208, system 156 may generate a total placement cost function (sometimes referred to herein as a complete placement cost function) based on wiring, timing, congestion, spread, and sector minimization constraints. The total placement cost function may be generated further based on each pair and each corresponding overlap region.

The total overlap cost functions may be combined with other cost functions to optimize global placement for the integrated circuit. The global placement may be optimized for wire length, operating frequency, congestion, overlap (sometimes referred to herein as spread), sector minimization, or any combination thereof using scaling constants. For example, an exemplary global placement cost function may be GlobalPlacementCostFunction=$\Sigma_i$WireCostFunction $(x_i)$+$\Sigma_i\alpha_i$TimingCostFunction$(x_i)$+ $\Sigma_i\beta_i$CongestionCostFunction$(x_i)$+$\Sigma_i\gamma_i$OverlapCostFunction $(x_i)$+$\Sigma_j\delta_j$SectorMinCostFunction$(x_j)$.

The wiring cost function, timing cost function, congestion cost function, or overlap cost function, were previously described in connection with FIG. 7. The additional term $\Sigma_j\delta_j$SectorMinCostFunction$(x_j)$ may be used to describe a sector minimization cost function, relating to FIGS. 10 and 11. As indicated by subscript j, the sector minimization cost function is iterated though j number of different clock signals (e.g., clock signals generated by the clock regions) in the design. The sector minimization cost function may similarly include a scaling constant $\delta_j$. As described for the other cost function terms, the sector minimization cost function term may be a combination of unit sector minimization cost function terms. For example, there may be j number of unit sector minimization cost function terms.

At step 1210 (similar to step 710 of FIG. 7), system 156 may provide the total placement cost function may to a solver (e.g., solver 157 of FIG. 2). Using the solver, optimal coordinates that fully define a location of each hardware resource may be generated.

At step 1212 (similar to step 712 of FIG. 7), system 156 may implement a logic design (e.g., logic design 800) of the hardware resources using the optimal coordinates. In other words, configuration data corresponding to placing the hardware resources at the optimal coordinate may be generated. If desired, steps 1210 and 1212 of FIG. 12 may be used in a similar manner as steps 710 and 712.

By performing overlap minimization or removal in this way, overlap minimization may be customized for different applications within logic design (e.g., implementing non-overlapping logic elements, implementing partially reconfigurable floating regions, implementing clock regions within minimum clock usage sectors, etc.). Overlap optimization can be made to the logic design in a resource-efficient and timing-optimized manner as the design is physically synthesized, with increased versatility to meet target overlap specifications for the entire design. In other words, system 156 may identify circuitry of at different levels of function (e.g., single logic elements, groups of logic elements, functional groups, reconfigurable floating regions, etc.) and minimize or remove overlap at any of these different levels.

This results in a tangible improvement to the functioning of logic design computing equipment 156 itself (e.g., by increasing the speed and efficiency with which the final configuration data is generated), an improvement to the logic design system of FIG. 2 (e.g., by increasing the speed and efficiency with which integrated circuit devices 100 may be programmed with configuration data for performing desired logic functions), and an improvement to the technology of optimizing and implementing logic designs for integrated circuit devices, for example.

The method and apparatus described herein may be incorporated into any suitable electronic device or system of electronic devices. For example, the method and apparatus may be incorporated into numerous types of devices such as microprocessors or other ICs. Exemplary ICs include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), digital signal processors (DSPs), graphics processing units (GPUs) just to name a few.

The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

The integrated circuit described herein may be part of a data processing system that includes one or more of the following components; a processor; memory; I/O circuitry; and peripheral devices. The integrated circuit can be used in a wide variety of applications, such as computer networking, data networking, instrumentation, video processing, digital signal processing, or any suitable other application where the advantage of using interconnection circuits that provide reset value holding capabilities is desirable.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. A method of using logic design computing equipment to generate configuration data for loading onto an integrated circuit, wherein the integrated circuit implements a logic design when loaded with the configuration data, the method comprising:

with the logic design computing equipment, identifying a first rectangular region of circuit elements within the logic design by identifying a first set of coordinates corresponding to at least two corners of the first rectangular region of circuit elements;

with the logic design computing equipment, identifying a second rectangular region of circuit elements within the logic design by identifying a second set of coordinates corresponding to at least two corners of the second rectangular region of circuit elements;

with the logic design computing equipment, identifying an overlap region between the first and second identified rectangular regions of circuit elements;

with the logic design computing equipment, defining a cost function based on the identified overlap region;

with the logic design computing equipment, minimizing the cost function to generate placement coordinates for the first and second rectangular regions of circuit elements;

with the logic design computing equipment, placing the first and second rectangular regions of circuit elements at the generated placement coordinates in the logic design to generate a placed logic design; and with the logic design computing equipment, generating the configuration data based on the placed logic design;

loading the configuration data onto the integrated circuit; and with the integrated circuit, implementing the logic design after being loaded with the configuration data.

2. The method defined in claim 1, wherein identifying the overlap region between the first and second identified rectangular regions of circuit elements comprises:

identifying a third set of coordinates corresponding to at least two corners of the overlap region based on the identified first and second sets of coordinates.

3. The method defined in claim 2, wherein identifying the third set of coordinates comprises providing at least some of the first and second sets of coordinates as inputs to a minimum operator and a maximum operator.

4. The method defined in claim 2, wherein defining the cost function based on the identified overlap region comprises:

providing the third set of coordinates as an input to the cost function; and providing the third set of coordinates as an input to a set of minimum and maximum operators that output a cost value.

5. The method defined in claim 1, wherein minimizing the cost function to generate placement coordinates for the first and second rectangular regions of circuit elements comprises:

when the generated placement coordinates provide an overlap between the first and second rectangular regions of circuit elements, generating an output value of one from the cost function.

6. The method defined in claim 1, wherein the first rectangular region of circuit elements within the logic design comprises a first floating region of the logic design and the second rectangular region of circuit elements within the logic design comprises a second floating region of the logic design, wherein each of the first and second floating regions performs a specialized function for the integrated circuit.

7. The method defined in claim 6, wherein a given one of the first and second rectangular regions of circuit elements within the logic design comprises a partially reconfigurable region of the integrated circuit.

8. The method defined in claim 1, wherein a given one of the first and second rectangular regions of circuit elements within the logic design comprises a blockage region, wherein the blockage region has a fixed location within the integrated circuit.

9. The method defined in claim 1, wherein the first rectangular region of circuit elements within the logic design comprises a clock signal generation region, and wherein the second rectangular region of circuit elements within the logic design comprises a sector region that is associated with a maximum allowed clock region usage region within the integrated circuit.

10. The method defined in claim 1, wherein the first and second rectangular regions of circuit elements within the logic design are spaced a given distance apart, wherein the given distance is specified as a pre-determined input parameter received by the logic design computing equipment.

11. The method defined in claim 1, wherein defining the cost function comprises:
   defining the cost function based on an additional overlap region between third and fourth rectangular regions of circuit elements within the logic design.

12. The method defined in claim 11, wherein defining the cost function further comprises:
   defining the cost function based on additional placement constraints of logic design.

13. The method defined in claim 12, wherein the additional placement constraints are selected from the group consisting of: wiring constraints, timing constraints, congestion constraints, spread constraints, and sector minimization constraints.

* * * * *